United States Patent [19]

Morioka et al.

[11] Patent Number: 5,694,021
[45] Date of Patent: Dec. 2, 1997

[54] SYSTEM FOR EXECUTING CHARGE CONTROL OF A SECONDARY BATTERY AND DETECTING THE CAPACITANCE THEREOF

[75] Inventors: Shizuo Morioka, Hanno; Nobuyuki Hosoya, Tokyo; Yoshiaki Ukiya, Tokyo; Katsuo Ozawa, Tokyo; Masayasu Tanaka, Tokyo, all of Japan

[73] Assignee: Kabushiki Kaisha Toshiba, Kawasaki, Japan

[21] Appl. No.: 395,504

[22] Filed: Feb. 27, 1995

[30] Foreign Application Priority Data

Feb. 28, 1994 [JP] Japan .................. 6-029196
Mar. 31, 1994 [JP] Japan .................. 6-064004
Sep. 30, 1994 [JP] Japan .................. 6-235792

[51] Int. Cl.$^6$ .................................. H01M 10/44
[52] U.S. Cl. .................................. 320/21
[58] Field of Search .................. 320/19–31

[56] References Cited

U.S. PATENT DOCUMENTS 5,565,756 10/1996 Urbish et al. .............. 320/15
5,576,608 11/1996 Nagai et al. .............. 320/22

FOREIGN PATENT DOCUMENTS 64-59179   3/1989  Japan .
2502379    6/1990  Japan .
2-193533   7/1990  Japan .
8-8466     4/1991  Japan .

*Primary Examiner*—Aditya Krishnan
*Attorney, Agent, or Firm*—Finnegan, Henderson, Farabow, Garrett & Dunner, L.L.P.

[57] ABSTRACT

A system comprises a rechargeable battery charged with a constant voltage and a charger. The battery includes a storage unit storing charge voltage data. The charger reads the charge voltage data from the storage unit and charges the battery in accordance with the read charge voltage data. In one aspect, the charger is assigned identification data to identify the charger and charge the battery. In another aspect, a charge controller includes a full-charge detecting means for detecting that the battery is fully charged based upon current measured from the battery.

9 Claims, 18 Drawing Sheets

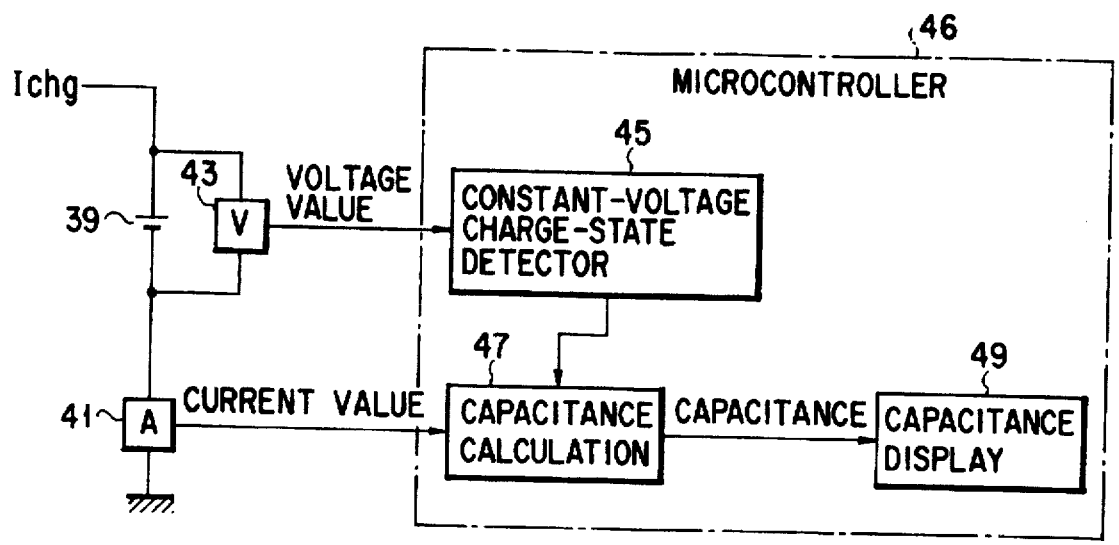
F I G. 6
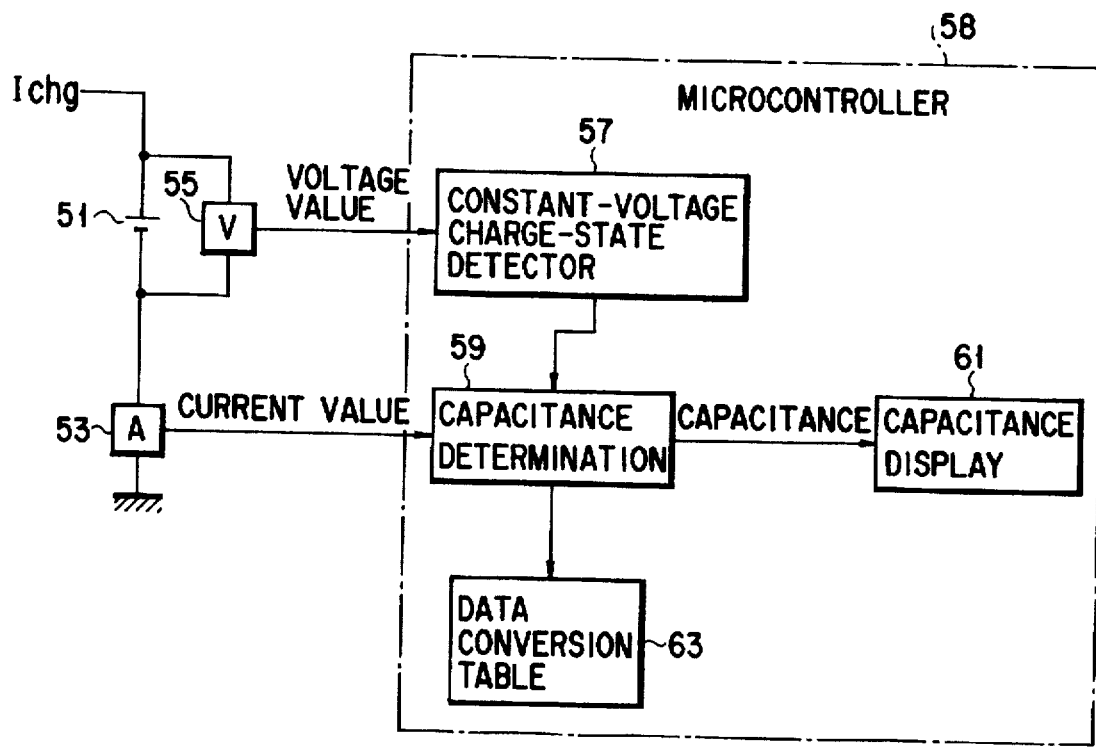
F I G. 7

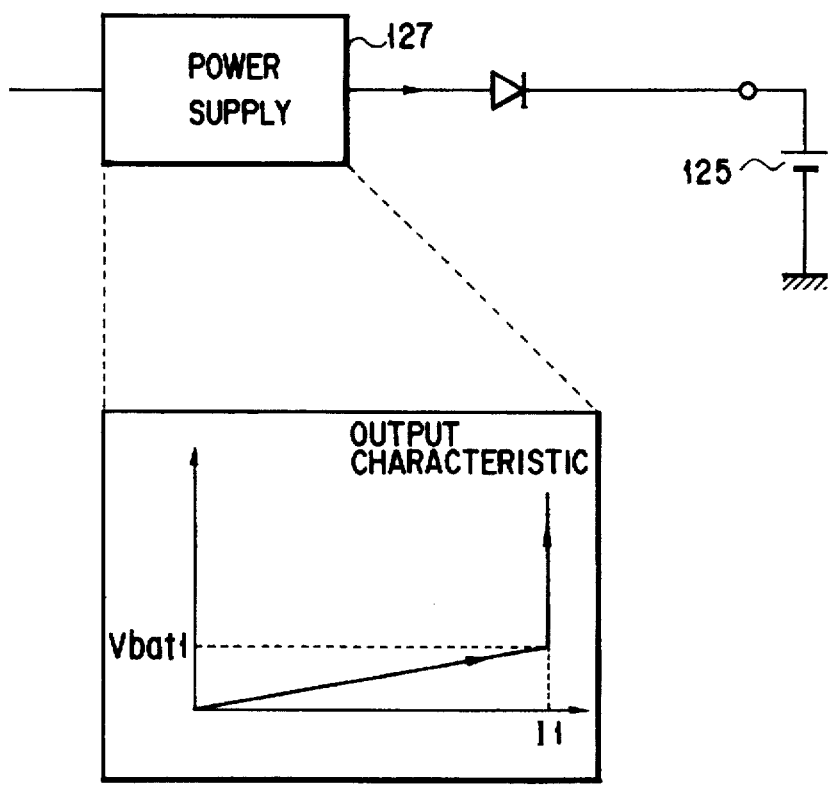
F I G. 19
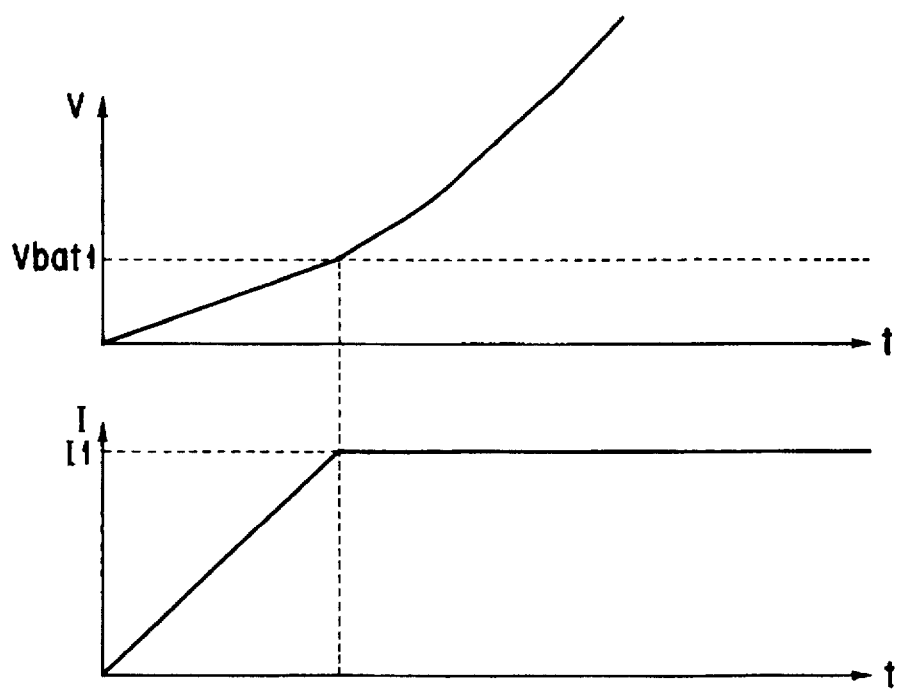
F I G. 20

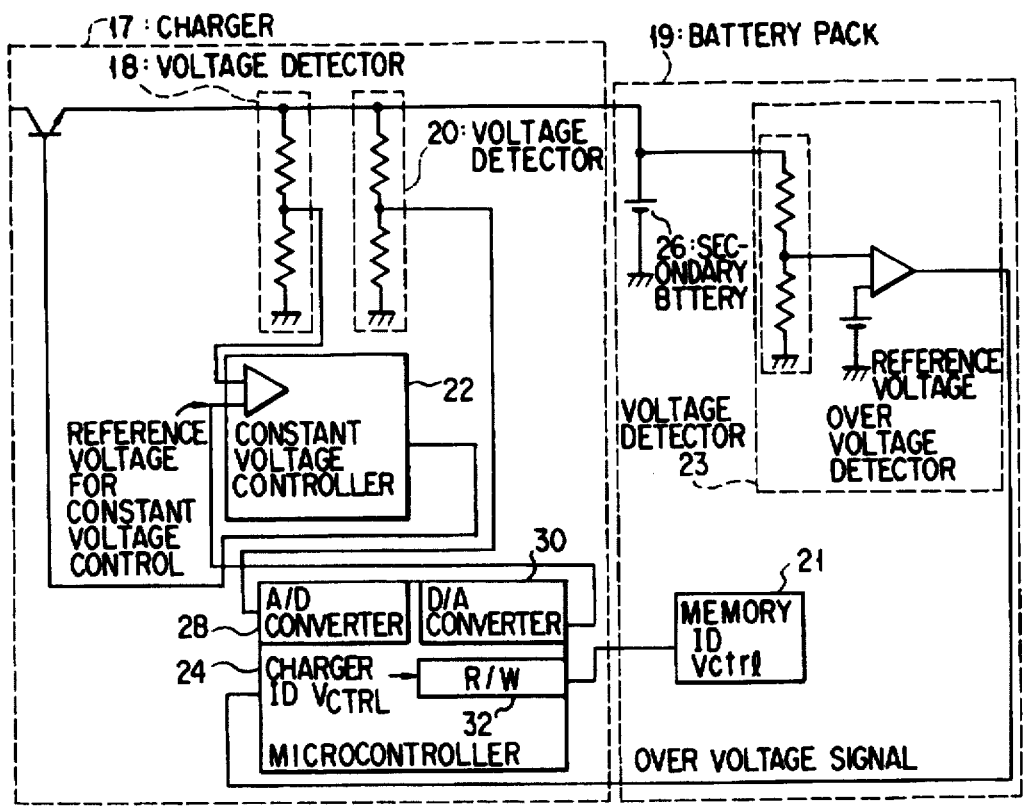
F I G. 23
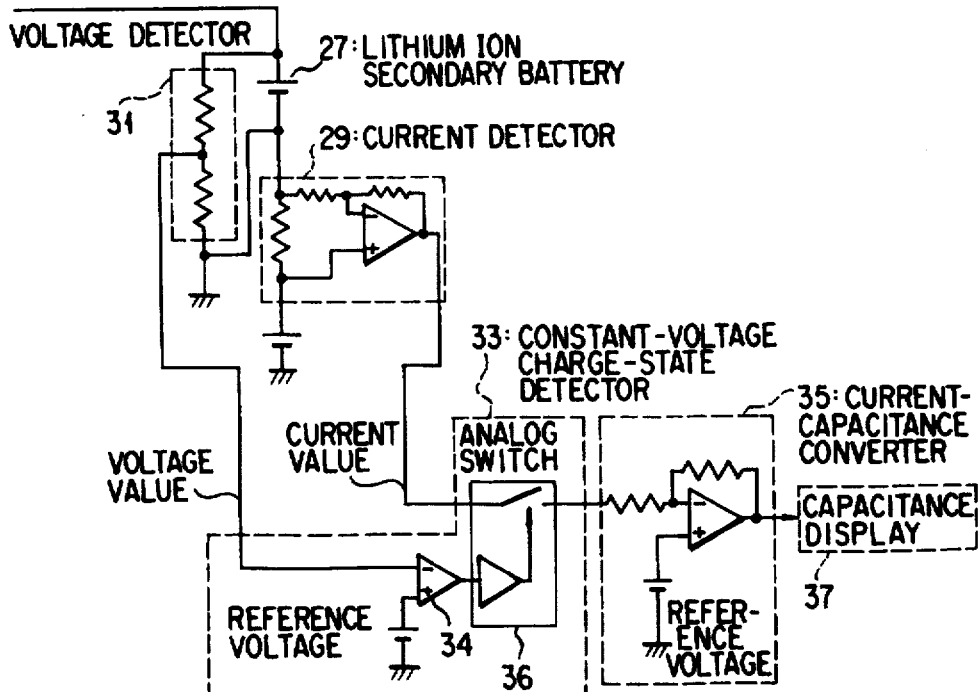
F I G. 25

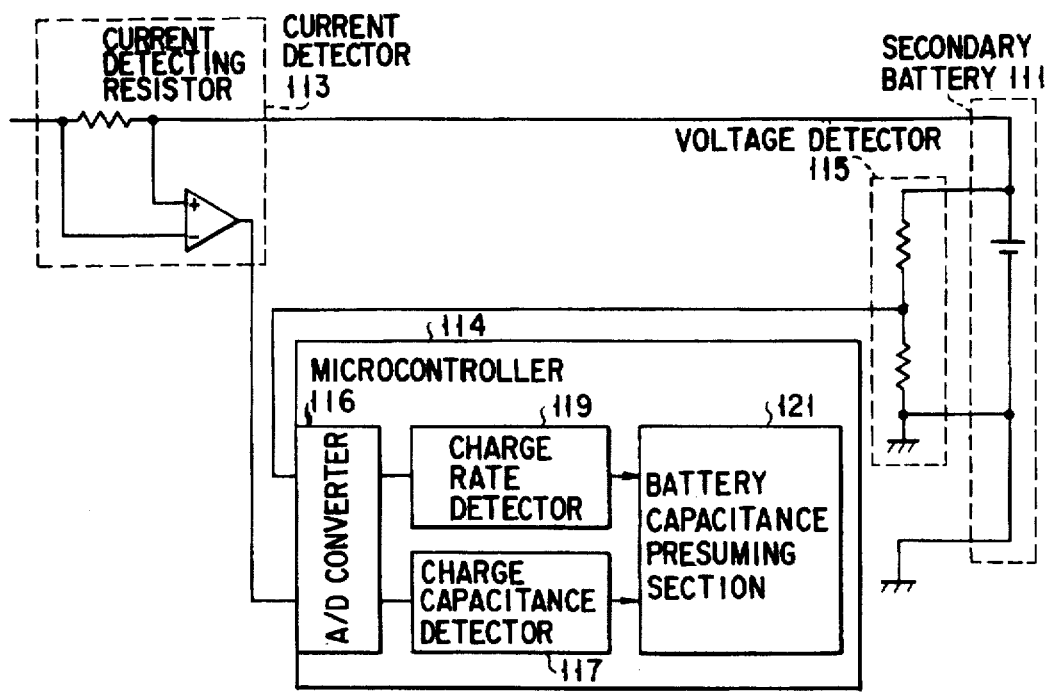
F I G. 31
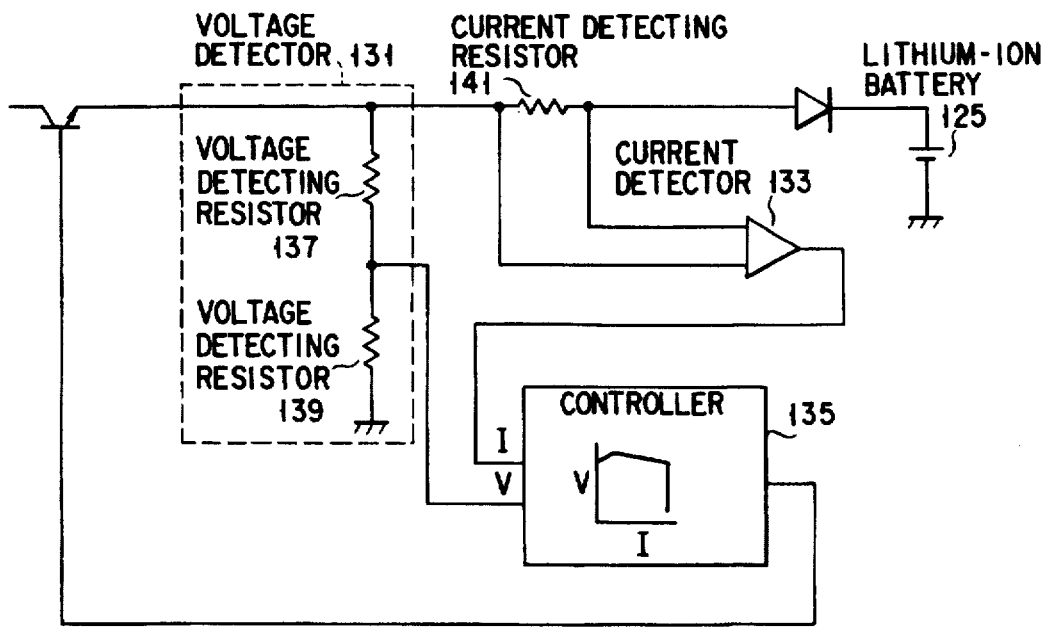
F I G. 32

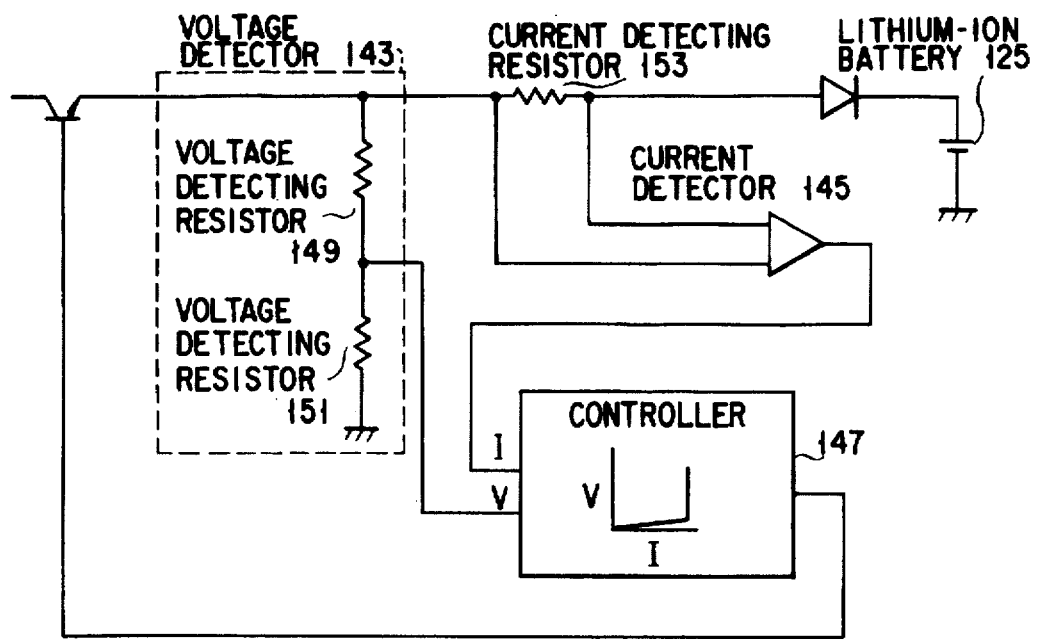
F I G. 33
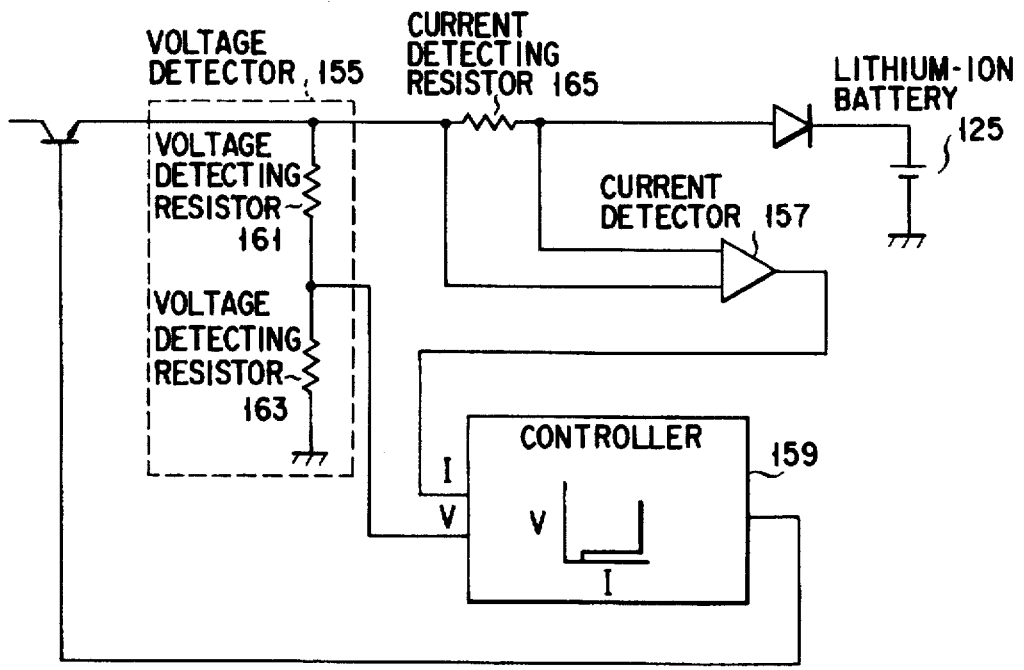
F I G. 34

SYSTEM FOR EXECUTING CHARGE CONTROL OF A SECONDARY BATTERY AND DETECTING THE CAPACITANCE THEREOF

BACKGROUND OF THE INVENTION

1. Field of the Invention

The present invention relates to an apparatus and method of performing charge control on, and detecting the capacitance of, a secondary battery which needs constant-voltage charge control.

2. Description of the Related Art

The charge capacitance of a secondary battery (e.g., a lithium ion battery) which needs constant-voltage charge control, such as a lithium battery, increases as the constant-voltage control voltage (hereinafter called "control voltage") becomes higher. Nonetheless, overvoltage charging cannot be performed on the battery from the safety viewpoint. To obtain a sufficient charge capacitance, therefore, it is necessary to effect charge control at as high a voltage as possible within the range of overvoltage.

Hitherto, a control system using a fixed control voltage should set the control voltage at a low level, since the voltages detected by voltage detectors provided in the system greatly differ due to the insufficient detection accuracy of the voltage detectors. To charge many types of batteries which have different overvoltages, the control voltage should be set low to match the low overvoltage.

Since the control voltage for constant-voltage control of the secondary battery (e.g., a lithium ion battery) is conventionally low, the battery cannot be charged to its full charge capacitance.

A lithium ion secondary battery is charged in two steps. First, it is charged with a constant current until the battery voltage reaches the maximum charge voltage. Then, the battery is charged at a constant voltage. To detect the capacitance the secondary battery has while undergoing the constant-current charge, the battery voltage is measured and the capacitance of the secondary battery is determined from the battery voltage measured. This is possible because the capacitance of the battery is proportional to the battery voltage. On the other hand, to detect the capacitance the battery has while undergoing the constant-voltage charge, a pulse charge is performed and the capacitance of the battery is determined from the battery voltage recorded while no current flows to the battery. Since the battery is charged at a constant voltage, the output voltage of the battery needs to be monitored all time to determine whether or not the battery has been fully charged.

With the conventional system it is necessity to perform pulse charge as long as the lithium ion secondary battery undergoes constant-voltage charge, and to effect charge control in order to detect the capacitance of the battery. Further, the monitoring of the output voltage of the battery does not help to detect a full-charge state of the battery with sufficient accuracy.

A lithium ion secondary battery is characterized in that its output voltage is approximately proportional to the rate of the residual capacitance. Thus, the residual capacitance rate can easily be detected from the battery voltage.

The conventional system has a memory storing the nominal capacitance or the like (i.e., a fixed value) as the allowable discharge capacitance which the battery can have when fully charged, and a detector for detecting the present residual capacitance from the allowable discharge capacitance and the residual rate detected from the battery voltage, and a display for displaying the present residual capacitance.

Some conventional systems are known in which any one of various types of battery packs having different capacitances (rated capacitances) can be installed. A system of this type has means for identifying the type of the battery set in the battery container to change the allowable discharge capacitance. Here arises a problem, due to the use of the residual capacitance detecting means is used in the case where the batteries have the same nominal capacitance and the same allowable discharge capacitance is applied for all batteries.

Generally, secondary batteries of this type differ in actual capacitance, even if they have the same nominal capacitance. Further, the capacitance of each battery gradually decreases due to the normal causes, such as the limited lifetime of the battery life. A battery pack with a different nominal capacitance may be added later. In this case, the residual capacitance cannot be detected with sufficient accuracy.

Nickel cadmium cells have long been popular as secondary batteries for use in personal computers. Recently, the nickel hydrogen battery have become more popular. Very recently lithium ion batteries, which have a higher energy density and less memory effect than nickel cadmium cells and nickel hydrogen batteries have been put to use. FIG. 1 shows the structure of a conventional charger for a lithium ion battery.

FIG. 1 shows a conventional charge apparatus. In the apparatus a power supply 1 charges a lithium ion battery 3. The power supply 1 has the output characteristic illustrated in FIG. 3. A trickle charger 5 is used to effect a trickle charge when the output voltage of the battery 3 becomes equal to or lower than a predetermined value and to perform a supplement charge after the battery 3 has been fully charged. A charge controller 7 controls a charge switching unit 9 to effect trickle charge, when the output voltage of the battery 3, measured by a voltage measuring unit 11, becomes equal to or falls below the predetermined value. When it is detected, based on the value measured by a current measuring unit 13, that the battery 3 has been fully charged, the charge controller 7 controls the charge switching unit 9 to start the supplement charge.

How the apparatus of FIG. 1 charges the lithium ion battery 3 will be described, with reference to FIG. 2.

When the output voltage of the battery 3 is higher than the predetermined value (Vth) at the start of the charging, the charge controller 7 switches the charge switching unit 9 to the side of the power supply 1. The battery 3 is thereby charged with a constant current of, for example, 2A. When the output voltage of the lithium ion battery 3 reaches the maximum charge voltage, the charging scheme is switched to constant-voltage charge at, for example, 12V. A full-charge state of the battery 3 is detected when the charge current measured during the constant-voltage charge becomes equal to or lower than a predetermined value. After the battery 3 has been fully charged, the charge controller 7 switches the charge switching unit 9 to the side of the trickle charger 5, thereby effecting supplement charge to prevent the charge capacitance from decreasing.

When the output voltage of the lithium ion battery 3 becomes equal to or lower than the predetermined value (Vth) at start of the charging, the charge controller 7 switches the charge switching unit 9 to the side of the trickle charger 5. Accordingly, the trickle charge, not the rapid charge, is executed.

As can be understood from the above, the conventional charge apparatus requires the switching from the power supply side to the trickle charger side in order to execute the supplement charge after the battery 3 has been fully charged. Alternatively, it needs to perform trickle charge when the battery voltage is low. The structure of the charge apparatus is inevitably complex in structure.

SUMMARY OF THE INVENTION

Accordingly, it is an object of the invention to provide a charge control apparatus which can perform a charge control at a sufficiently high voltage even if voltage detectors provided in chargers have a low detection accuracy, inevitably giving rise to a great difference among the voltages detected by the voltage detectors, which can set a control voltage in accordance with the overvoltage of any one of batteries having different overvoltages, which is to be charged, thereby ensuring a charge control with a sufficient charge capacitance matched with the battery characteristic.

It is another object of this invention to provide a full-charge detecting apparatus which detects, by using a simple means, the capacitance and full-charge state of a secondary battery which is undergoing a constant-voltage charge and which needs to be charged at a constant current and a constant voltage.

It is a further object of the invention to provide a capacitance detecting apparatus which can detect the latest allowable discharge capacitances of secondary batteries which differ in real capacitance or whose capacitances have been reduced due to the cycle life or the like.

It is a still another object of this invention to provide a charger which can automatically perform supplement charge on a secondary battery after the battery has been fully charged or can automatically perform trickle charge on the battery when the output voltage of the battery is low, in accordance with the output characteristic of a power supply, without using a special control mechanism.

According to a first aspect of this invention, there is provided a system comprising a secondary battery requiring constant-voltage charge control, and a charger for charging the secondary battery, the secondary battery comprising an overvoltage detector for detecting an overvoltage and a storage unit for storing information sent from the charger, the charger comprising constant-voltage control means, battery-voltage detecting means for reading an overvoltage detection signal from the secondary battery, means for sending information to the storage unit and means for reading the information from the storage unit, wherein the charge controller gradually increases a charge voltage, determines a constant-voltage control voltage from the voltage the battery outputs when an overvoltage is detected, stores into the storage unit the control voltage and identification data assigned to the charger, and performs a charge control at the control voltage stored in the storage unit, when the identification data stored in the secondary battery when the secondary battery is coupled to the charger for the next time is identical to the identification information assigned to the charger.

According to a second aspect of this invention, there is provided a capacitance detecting apparatus for use in a charge controller for a secondary battery to be charged at a constant voltage, the apparatus comprising: current measuring means for measuring a charge current of a secondary battery; constant-voltage charge state detecting means for detecting that the secondary battery is in a constant-voltage charge state; and a current-to-capacitance converter for converting the current value measured by the current measuring means to a capacitance value of the secondary battery when the constant-voltage charge state detecting means detects that the secondary battery is in a constant-voltage charge state, wherein the capacitance value of the secondary battery is obtained from the current value when the secondary battery assumes the constant-voltage charge state.

According to a third aspect of the invention, there is provided a capacitance detecting apparatus for use in a charge controller for a secondary battery to be charged at a constant voltage, the apparatus comprising: current measuring means for measuring a charge current of a secondary battery; constant-voltage charge state detecting means for detecting that the secondary battery is in a constant-voltage charge state; and calculating means for calculating a capacitance of the secondary battery, which corresponds to the current measured by the current measuring means when the constant-voltage charge state detecting means detects that the secondary battery is in the constant-voltage charge state, wherein the capacitance value of the secondary battery is obtained from the current value when the secondary battery is in the constant-voltage charge state.

According to a fourth aspect of this invention, there is provided a capacitance detecting apparatus for use in a charge controller for a secondary battery to be charged at a constant voltage, the apparatus comprising: current measuring means for measuring a charge current of a secondary battery; constant-voltage charge state detecting means for detecting that the secondary battery is in a constant-voltage charge state; and a data conversion table for obtaining a capacitance of the secondary battery, which corresponds to the current measured by the current measuring means when the constant-voltage charge state detecting means detects that the secondary battery is in the constant-voltage charge state, wherein the capacitance value of the secondary battery is obtained from the current value when the secondary battery in the constant-voltage charge state.

According to a fifth aspect of this invention, there is provided a full-charge detecting apparatus for use in a charge controller for a secondary battery to be charged at a constant voltage, the apparatus comprising: current measuring means for measuring a charge current of a secondary battery; constant-voltage charge state detecting means for detecting that the secondary battery is in a constant-voltage charge state; and full-charge detecting means for detecting that the secondary battery is fully charged, if the current measured by the current measuring means is equal to or lower than a predetermined value when the constant-voltage charge state detecting means detects that the secondary battery assumes the constant-voltage charge state.

According to a sixth aspect of this invention, there is provided a full-charge detecting apparatus for use in a charge controller for a secondary battery to be charged at a constant voltage, the apparatus comprising: current measuring means for measuring a charge current of a secondary battery; constant-voltage charge state detecting means for detecting that the secondary battery is in a constant-voltage charge state; and full-charge detecting means for detecting that the secondary battery is fully charged, if the ratio of the current measured by the current measuring means to the current output by the secondary battery undergoing constant-current charge is equal to or less than a predetermined ratio when the constant-voltage charge state detecting means detects that the secondary battery assumes the constant-voltage charge state.

According to the present invention, no constant-voltage control is performed during initial charging effected after the battery has been coupled to a charger. The charge controller gradually increases the charge voltage, determines the control voltage from the voltage the battery outputs when an overvoltage of the secondary battery is detected, performs constant-voltage control at this control voltage in the next charging, stores the control voltage and identification data assigned into the charger, and performs the constant-voltage control at the control voltage represented by data stored in the secondary battery when the stored identification data is found identical to the identification data assigned to the charger at the battery is installed again.

Further, a charge controller for a secondary battery to be charged at a constant voltage converts the current measured by the current-measuring means to a capacitance when constant-voltage charge state detecting means detects that the secondary battery has assumed a constant-voltage charge state.

Further, a charge controller for a secondary battery to be charged at a constant voltage calculates by the capacitance-calculating means, a capacitance from the current measured by the current-measuring means to a capacitance when the constant-voltage charge state detecting means detects that the secondary battery has assumed a constant-voltage charge state.

Further, a charge controller for a secondary battery to be charged at a constant voltage obtains by using the data conversion table a capacitance which corresponds to the current measured by the current measuring means when the constant-voltage charge state detecting means detects that the secondary battery has assumed a constant-voltage charge state.

Further, a charge controller for a secondary battery to be charged at a constant voltage detects that the secondary battery is fully charged, if the current measured by the current measuring means is equal to or lower than a predetermined value when the constant-voltage charge state detecting means detects that the secondary battery assumes the constant-voltage charge state.

Further, a charge controller for a secondary battery to be charged at a constant voltage detects that the secondary battery is fully charged, if the ratio of the current measured by the current measuring means to the current output by the secondary battery undergoing constant-current charge is equal to or less than a predetermined ratio when the constant-voltage charge state detecting means detects that the secondary battery assumes the constant-voltage charge state.

According to a seventh aspect of this invention, there is provided a capacitance detecting apparatus for a secondary battery whose charge capacitance and discharge capacitance are substantially equal, the apparatus comprising: residual capacitance detecting means for detecting whether or not there is a residual capacitance before charging of the secondary battery starts; charge capacitance detecting means for detecting a charge capacitance of the secondary battery; and battery capacitance detecting means for detecting a battery capacitance which has been built up after the residual capacitance detecting means has detected no residual capacitance until the secondary battery is fully charged and which has been detected by the charge capacitance detecting means, wherein the latest allowable discharge capacitance of the secondary battery is detected from the battery capacitance detected by the battery capacitance detecting means.

According to an eighth aspect of this invention, there is provided a detecting apparatus for a secondary battery whose charge capacitance and discharge capacitance are substantially equal, the apparatus comprising: means for detecting a charge rate from a battery voltage of the secondary battery; means for detecting a charge capacitance of the secondary battery; and means for detecting a charge capacitance between individual charge rates at time points when the secondary battery output different voltages, from the charge rates at the time points, and predicting the capacitance which the secondary battery will have when fully charged, from the detected charge capacitance, to thereby determine the latest allowable discharge capacitance of the secondary battery.

More specifically, according to an arrangement of the present invention shown in FIG. 10, in preparation for charging a secondary battery 97, a voltage detector 101 detects the output voltage of the battery 97 and supplies the voltage value to a residual capacitance-determining section 105. The section 105 determines from the voltage detected by detector 101 whether or not the battery 97 has a residual capacitance before it is charged. The section 105 sends the detection result to a charge capacitance detector 103. Meanwhile, a current detector 99 measures the charge current of the battery 97 and supplies the current value to the charge capacitance detector 103. When the section 105 determines that the secondary battery 97 has no residual capacitance, the charge capacitance detector 103 calculates the charge capacitance of the battery 97 from the charge current measured by the current detector 99, and outputs this capacitance as an allowable discharge capacitance. Since the charge capacitance at the end of charging is detected as the allowable discharge capacitance, the allowable discharge capacitance specific to each battery pack 91 can always be detected. Thus, the present allowable discharge capacitance of the installed battery pack 91 can be detected accurately.

Further, according to an arrangement of the present invention shown in FIG. 12, a charge rate detector 119 detects charge rates at battery voltage levels A and B of a secondary battery 111 as is shown in FIGS. 13 and 14. A charge capacitance detector 117 detects the charge capacitance from the level A to the level B. A battery capacitance-presuming section 121 predicts the battery capacitance in the full-charge state from [battery capacitance in full-charge state= C/(b−a)×100] based on a charge rate a % at the level A, a charge rate b % at the level B and the charge capacitance C from the level A to the level B. The section 121 detects and outputs the battery capacitance in the full-charge state as the allowable discharge capacitance. Accordingly, only if the charge rates at two points or the discharge capacitance between these points are detected during, before or after the charging, the allowable discharge capacitance of each installed battery pack can easily be predicted and the present allowable discharge capacitance of the installed battery pack can accurately be detected.

According to a ninth aspect of the invention, there is provided a charging apparatus for a lithium ion battery, which comprises: a constant-current power supply circuit, and a constant-voltage power supply. The power supply is characterized in that when an output current value is equal to or lower than a predetermined value, a value indicating a change (dv) in an output voltage (v) with respect to a change (di) in the output current value (i) is positive (dv/di>0) and when the output current value exceeds a predetermined value, the value indicating the change (dr) in the output voltage (v) with respect to the change (di) in the output current value (i) is negative (dv/di<0). The supplement charge of the lithium ion battery can thereby be effected, thanks to the output characteristic of the constant-voltage power supply circuit.

In this charging apparatus, when the lithium ion battery becomes fully charged by the constant-voltage charging operation by the constant-voltage power supply circuit, no current flows. The output characteristic of the constant-voltage power supply circuit is therefore automatically switched to the characteristic of dv/di>0 from the characteristic of dv/di<0. When the battery voltage of the lithium ion battery drops thereafter due to the self discharge, the charging starts with the characteristic of dv/di>0. This charging operation is performed until the lithium ion battery becomes fully charged. Thereafter, every time the battery voltage of the lithium ion battery falls, the charging operation with the characteristic of dv/di>0 is executed. Therefore, it is possible to intermittently perform the charging operation with the current value relatively limited by the characteristic of dv/di>0 and automatically execute the supplement charge after the full-charge state without providing a special control mechanism.

According to a tenth aspect of the invention, there is provided a charging apparatus which comprises: a power supply circuit characterized in that when an output voltage value is equal to or lower than a predetermined value, a value indicating a change (dv) in an output voltage (v) with respect to a change (di) in the output current value (i) is positive (dv/di>0) and when the output current value is limited to be smaller than a first value and the output voltage value exceeds the predetermined value, the output current value becomes a constant current of the first value. Thus, as the voltage of the lithium battery becomes lower, the lithium ion battery can be charged with a smaller output current value.

In this charging apparatus, when the battery voltage of the lithium ion battery is low, charging is performed with the current which is automatically decreased. Trickle charge can automatically be performed at a low battery voltage, without using a special control unit.

According to an eleventh aspect of the invention, there is provided a charging apparatus which comprises a power supply circuit having an output characteristic that, when an output voltage value is equal to or lower than a predetermined value, an output current value is defined to be a first value, and when the output voltage value exceeds the predetermined value, the output current value is defined to be a second value greater than the first value. Therefore, when the voltage of the lithium battery is equal to or lower than the predetermined value, the lithium ion battery can be charged with a current value smaller than the current value when the voltage of the lithium ion battery exceeds the predetermined value.

In this charging apparatus, too, when the battery voltage of the lithium ion battery is low, charging is performed with the current which is automatically decreased. Trickle charge can automatically be performed at a low battery voltage, without using a special control unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a block diagram of a third embodiment of the present invention;

FIG. 7 is a block diagram of a fourth embodiment of the present invention;

FIG. 19 is a diagram of a charging apparatus according to a tenth embodiment of this invention and its output characteristic;

FIG. 20 is a diagram showing the charging operation of the charging apparatus in FIG. 19;

FIG. 23 is a detailed circuit diagram of the first embodiment shown in FIG. 4;

FIG. 25 is a detailed circuit diagram of the second embodiment shown in FIG. 5;

FIG. 31 is a detailed circuit diagram of the electronic equipment main body 109 shown in FIG. 12;

FIG. 32 is a detailed circuit diagram of the power supply 123 shown in FIG. 15;

FIG. 33 is a detailed circuit diagram of the power supply 127 shown in FIG. 19; and FIG. 34 is a detailed circuit diagram of the power supply 129 shown in FIG. 21.

DETAILED DESCRIPTION OF THE PREFERRED EMBODIMENTS

Embodiment of the present invention will now be described, with reference to the accompanying drawings.

Figure 4:
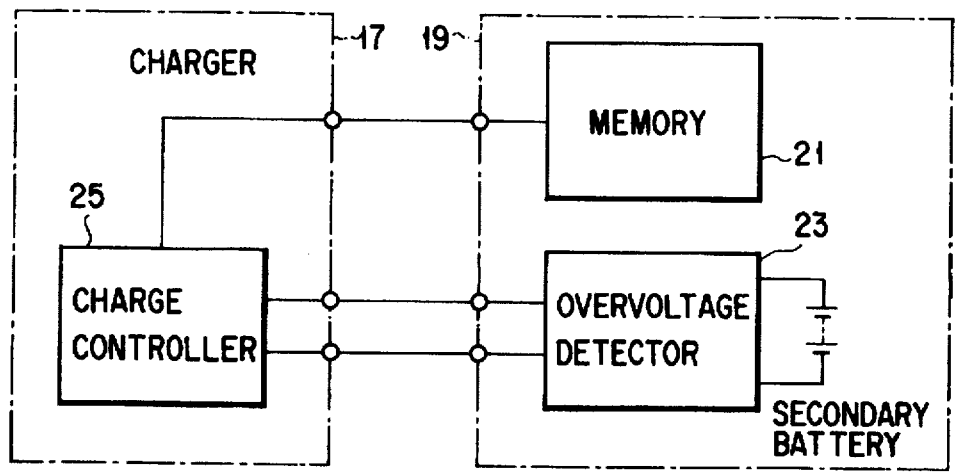
FIG. 4 is a block diagram of a first embodiment of the present invention.

FIG. 4 is a block diagram showing the first embodiment of the invention. As shown in FIG. 4, the system according to the first embodiment comprises a charger 17 and a secondary battery 19. The charger 17 is provided for charging the secondary battery 19. The secondary battery 19 (a battery pack) comprises, for example, a lithium ion battery which needs to be charged at a constant voltage.

The secondary battery 19 contains a memory 21 and an overvoltage detector 23. The memory 21 is used to store data showing a control voltage, data identifying the charger 17 and similar data. The detector 23 is provided to detect an overvoltage which may be applied while the secondary battery 19 is being charged.

The charger 17 has a charge controller 25. The controller 25 is designed to detect the output voltage of the secondary battery 19 and to control the charging thereof. More specifically, the controller 25 performs access control on the memory 21 incorporated in the secondary battery 19. The charge controller 25 comprises a constant voltage controlling section, a voltage measuring section for detecting the output voltage of the secondary battery 19, a signal reading section for reading an overvoltage signal supplied from the secondary battery 19, and a memory accessing unit for writing data such as the control voltage into the memory 21 and reading data therefrom.

At the start of the charging of the battery 19, the controller 25 begins to increase the charge voltage gradually. The controller 25 detects an overvoltage, if any, and determines the voltage suitable for the constant voltage control, from the voltage the battery 19 outputs at the moment it detects the overvoltage. The controller 25 writes the data representing the control voltage (hereinafter called "control voltage data") and the ID data assigned to the charger 17, into the memory 21 incorporated in the secondary battery 19.

When the secondary battery 19 is coupled to the charger 17 for the next time, the controller 25 compares the ID data stored in the memory 21 with the ID data assigned to the charger 17. If the ID data items compared are identical, the controller 25 will perform charging control at the voltage represented by the control voltage data stored in the memory 21.

FIG. 23 is a detailed circuit diagram of the charger 17 and the battery pack 19 shown in FIG. 4. As shown in FIG. 23, the charge controller 25 shown in FIG. 4 comprises voltage detectors 18, 20, the constant voltage controller 22, and a microcontroller 24. The voltage detectors 18, 20 detect a voltage of a secondary battery 26 in the battery pack 19. The constant voltage controller 22 performs a constant voltage charge control for the secondary battery 26 based on the voltage detected by the voltage detector 18 and a reference voltage for constant voltage control. The microcontroller 24 is provided with an A/D converter 28, a D/A converter 30, and a read/write circuit 32. The A/D converter 28 converts an analog voltage value detected by the voltage detector 20 into a digital value. The D/A converter 30 converts the digital reference voltage for constant voltage control into an analog value to be supplied to the constant voltage controller 22. The read/write circuit 32 read/write accesses the memory 21 in the battery pack 19.

The operation of the system shown in FIG. 4 will be explained.

When he secondary battery 19 is coupled to the 10 charger 17, the charge controller 25 reads the ID data of the charger 17 from the memory 21 provided in the battery 19. If the ID data thus read differs from the ID data assigned to the charger 17, the controller 25 performs [Charging 1]. If the ID data is identical to the ID data of the charger 17, the controller 25 performs [Charging 2].

[Charging 1]

First, the charger 17 raises the charge voltage gradually, without effecting constant voltage control. The overvoltage detector 23 contained in the secondary battery 19 detects an overvoltage, if any. The charge controller 25 reads an overvoltage signal from the detector 23 and also detects the voltage Vout (V) which the charger 17 output at present. Then, the controller 25 determines an optimal control voltage VCTRL (V) in accordance with the following equation:

$$VCTRL = Vout - \alpha$$

where $\alpha$ is the margin (V) for the maximum changing voltage. The charge controller 25 supplies the ID data of the charger 17 and the control voltage data to the secondary battery 19. These data items are written into the memory 21.

[Charging 2]

The charge controller 25 reads the control voltage data from the memory 21 and performs constant voltage control in accordance with the value it has received during the charging of the secondary battery 19.

By virtue of the charge control which consists of [Charging 1] and [Charging 2], any type of a battery can be charged with a charge capacitance suitable for the battery, whatever value the overvoltage has.

Figure 24:
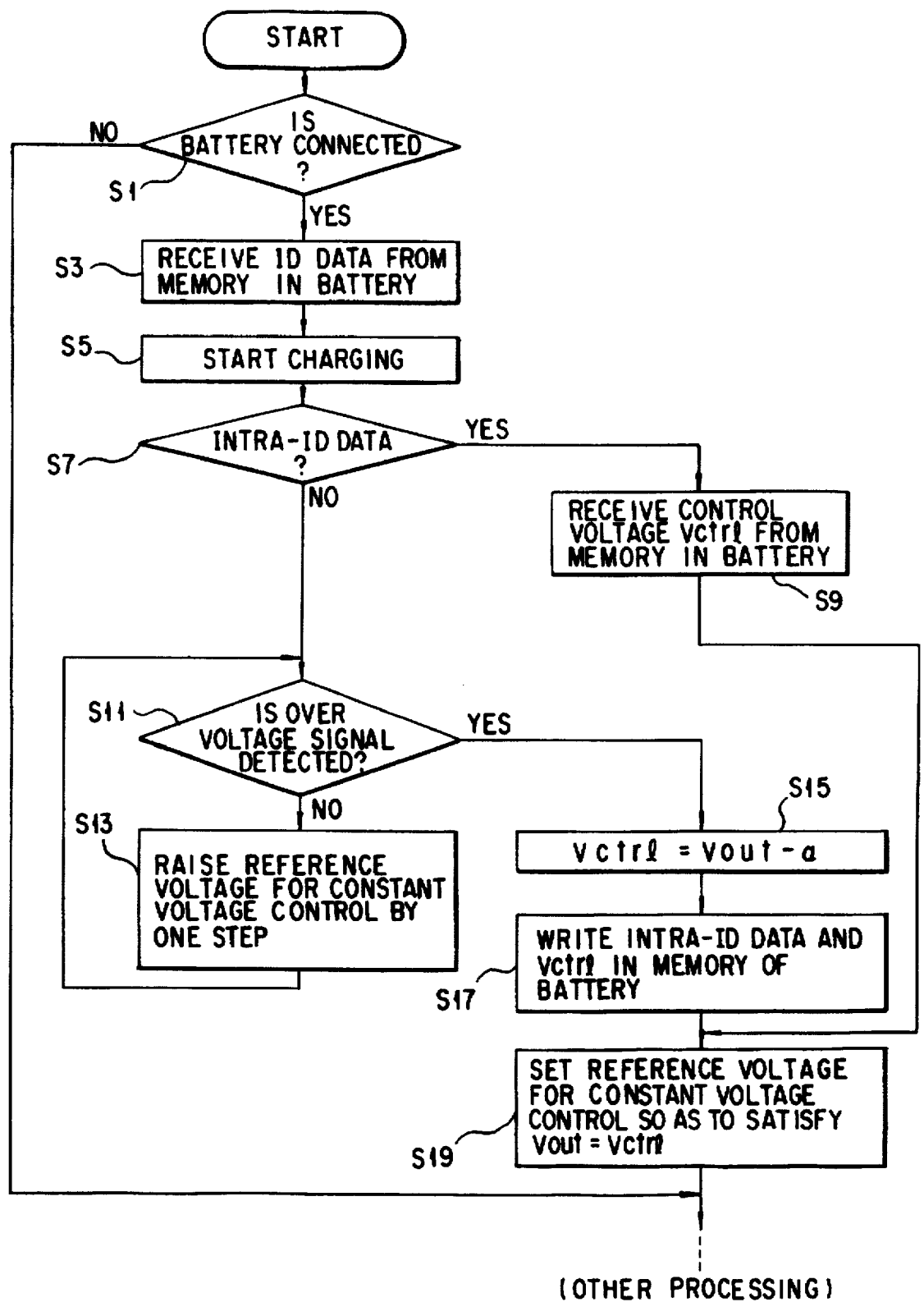
FIG. 24 is a flowchart showing an operation of the microcontroller shown in FIG. 23.

FIG. 24 is a flowchart showing the operation of the microcontroller 24 shown in FIG. 23. In step S1, the microcontroller 24 determines whether the battery pack 19 is connected or not. Upon detecting that battery pack 19 is connected, the microcontroller 24 reads the ID data of the charger 17 from the memory 21 in the pack 19 through the read/write circuit 32 (step S3). Then, in step S5, the microcontroller 24 starts the charge operation. In step S7, the microcontroller 24 determines whether the read ID data is the ID data of the intra charger 17 or not. If the determination is affirmative in step S7, the microcontroller 24 reads the control voltage Vctrl from the memory 21 in the battery pack 19 (step S9). Then, in step S19, the microcontroller 24 sets the reference voltage for constant voltage control so as to satisfy Vout=Vctrl and outputs it to the constant voltage controller 22 through the D/A converter 30.

On the other hand, if the determination in step S7 is non-affirmative, the microcontroller 24 determines in step S11 whether or not the overvoltage signal is detected. If the overvoltage is not detected, the microcontroller 24 raises the reference voltage for constant voltage control by one step (step S13), and returns to step S11.

If the detection of the overvoltage is determined in step S11, the microcontroller 24 sets the constant voltage control voltage Vctrl to a value of (Vout−α) (step S17). Then, in step S19, the microcontroller 24 sets the reference voltage for constant voltage control so as to satisfy Vout=Vctrl.

A system according to the second embodiment of the invention will be described, with reference to FIG. 5 which is a block diagram.

Figure 5:
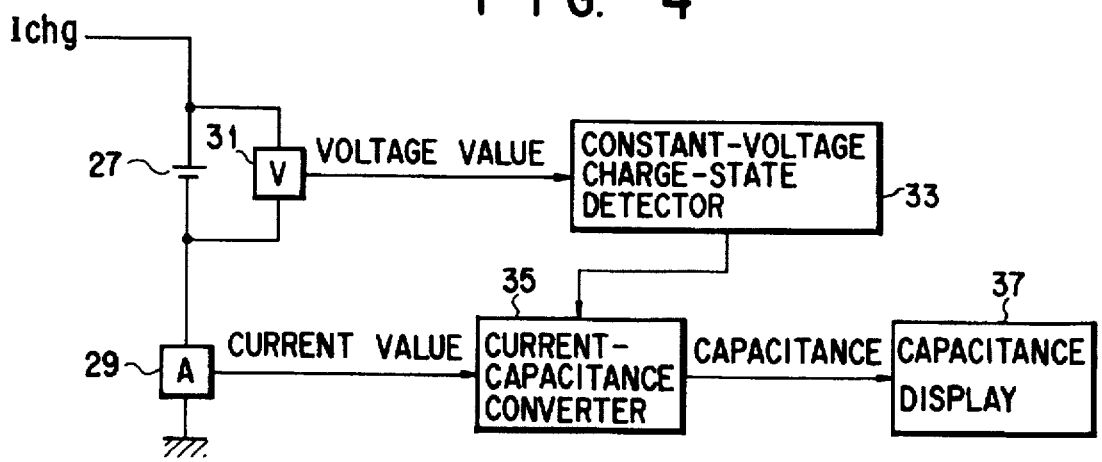
FIG. 5 is a block diagram of a second embodiment of the present invention.

As shown in FIG. 5, the system comprises a lithium ion secondary battery 27, an ammeter 29, and a voltmeter 31. The secondary battery 27 is to be charged at a constant current and a constant voltage. The ammeter 29 is used to measure the charge current (Ichg) supplied to the secondary battery 27. The voltmeter 31 is provided for measuring the charge voltage applied to the secondary battery 27.

The system further comprises a constant-voltage charge state detector 33, a current-capacitance converter 35, and a capacitance display 37. The detector 33 is used to monitor the charge voltage measured by the voltmeter 31 and detects whether or not the secondary battery 27 is in a constant-voltage charge state. The converter 35 is designed to convert the current value measured by the ammeter 29 to a capacitance when the detector 33 detects that the secondary battery 27 assumes a constant-voltage charge state. The display 37 is provided for displaying the capacitance of the secondary battery 27, which the converter 35 has converted from the input current value.

FIG. 25 is a detailed circuit diagram of the second embodiment shown in FIG. 5. The constant-voltage charge-state detector 33 includes a voltage comparator 34 and an analog switch 36. The voltage comparator 34 compares a voltage supplied from the voltage detector 31 with a reference voltage to detect the constant voltage charge state. Upon detecting the constant-voltage charge state, the voltage comparator 34 outputs the detection signal to the analog switch 36. In response to the detection signal, the analog switch 36 turns on. As a result, a current detected by the current detector 29 is supplied to the current-capacitance converter 35. The current-capacitance converter 35 converts the supplied current into a capacitance.

The operation of the system shown in FIG. 5 will be explained.

The constant-voltage charge state detector 33 keeps monitoring the charge voltage measured by the voltmeter 31. Upon detecting that the secondary battery 27 assumes a constant-voltage charge state, the detector 33 activates the current-capacitance converter 35. Then, the converter 35 converts the current value measured by the ammeter 29, to a capacitance value. The capacitance value is supplied to the capacitance display 37. The display 37 displays the capacitance value.

A system according to the third embodiment of the invention will be described, with reference to FIG. 6 which is a block diagram.

As shown in FIG. 6, the system comprises a lithium ion secondary battery 39, an ammeter 41, and a voltmeter 43. The secondary battery 39 is to be charged at a constant current and a constant voltage. The ammeter 41 is provided to measure the charge current (Ichg) supplied to the secondary battery 39. The voltmeter 43 is provided for measuring the charge voltage applied to the secondary battery 39.

The system further comprises a constant-voltage charge state detector 45, a capacitance calculator 47, and a capacitance display 49. The detector 45 is used to monitor the charge voltage measured by the voltmeter 43 and detects whether or not the secondary battery 39 is in a constant-voltage charge state. The capacitance calculator 47 is designed to calculate the charge capacitance of the lithium ion secondary battery 39. The calculator 47 has an algorithm for calculating a capacitance value from a current value. More correctly, the calculator 47 calculates a capacitance value from the current value measured by the ammeter 41, when the detector 45 detects that the secondary battery 39 assumes a constant-voltage charge state. The display 49 is provided for displaying the capacitance of the secondary battery 39, which the calculator 47 has converted from the input current value. The detector 45, the calculator 47 constitute a microcontroller 46.

The operation of the system shown in FIG. 6 will now be explained.

The constant-voltage charge state detector 45 continues to monitor the charge voltage measured by the voltmeter 43, thus detecting whether or not the secondary battery 39 is in a constant-voltage charge state. When the detector 45 detects that the secondary battery 39 assumes a constant-voltage charge state, it activates the capacitance calculator 47. The calculator 47 calculates a capacitance value from the current value measured by the ammeter 41. The capacitance value, thus calculated, is supplied to the capacitance display 49. The display 49 displays the capacitance value.

Figures 26, 27:
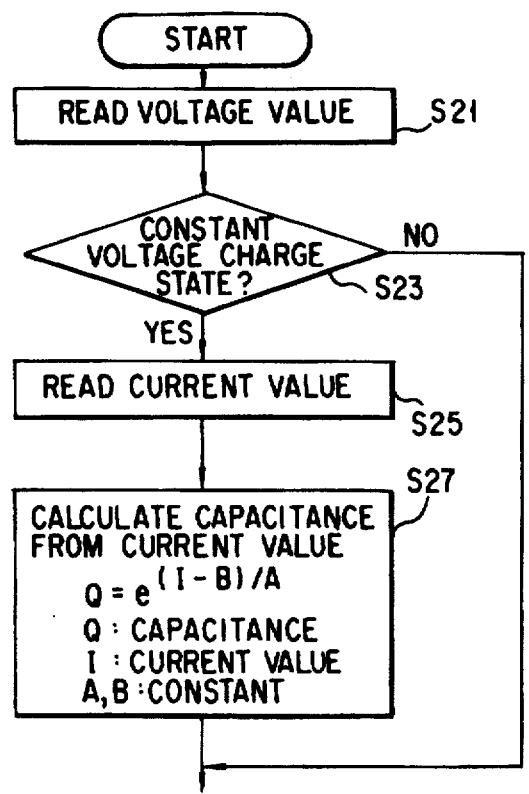
FIG. 26 is a flowchart showing an operation of the microcontroller shown in FIG. 6.
FIG. 27 is a flowchart showing an operation of the microcontroller shown in FIG. 7.

FIG. 26 is a flowchart showing an operation of the microcontroller 46 shown in FIG. 6. In step S21, the microcontroller 46 reads a voltage value from the voltage detector 43. Then, the microcontroller 46 determines whether or not the current state is the constant voltage charge state based on the read voltage value. If the current state is the constant voltage charge state, the microcontroller 46 reads a current value from the current detector 41. Then, the microcontroller 46 calculates a capacitance from the read current value in accordance with the equation $Q=e^{(J-B)/A}$.

A system according to the fourth embodiment of the present invention will be described, with reference to FIG. 7 which is a block diagram.

As illustrated in FIG. 7, the system comprises a lithium ion secondary battery 51, an ammeter 53, and a voltmeter 55. The secondary battery 51 is to be charged at a constant current and a constant voltage. The ammeter 53 is employed to measure the charge current (Ichg) supplied to the secondary battery 51. The voltmeter 55 is provided for measuring the charge voltage applied to the secondary battery 51.

The system further comprises a constant-voltage charge state detector 57, a capacitance-determining section 59, a capacitance display 61, and a data conversion table 63. The detector 75 is used to monitor the charge voltage measured by the voltmeter 55 and detects whether or not the secondary battery 51 is in a constant-voltage charge state. The capacitance-determining section 59 is designed to determine the charge capacitance of the lithium ion secondary battery 51 from the current value measured by the ammeter 53, with reference to the data conversion table 63, when the detector 57 detects that the secondary battery 51 assumes a constant-voltage charge state. The display 61 is provided for displaying the capacitance of the secondary battery 51, which the section 59 has determined from the input current value. The data conversion table 63 stores various capacitance values and various corresponding current values, and is referred to by the capacitance-determining section 59. The detector 57, the section 59, the display 61 and the table 63 constitute a microcontroller 58.

It will be explained how the system of FIG. 7 perform its operation.

The constant-voltage charge state detector 57 keeps monitoring the charge voltage measured by the voltmeter 55, thus detecting whether or not the secondary battery 51 is in a constant-voltage charge state. Upon detecting that the secondary battery 39 assumes a constant-voltage charge state, the detector 57 activates the capacitance-determining section 59. The section 59 determines a capacitance value from the current value measured by the ammeter 53, with reference to the data conversion table 63. The capacitance value, thus determined, is supplied to the capacitance display 61. The display 61 displays the capacitance value.

FIG. 27 is a flowchart showing an operation of the microcontroller 58 shown in FIG. 7. In step S31, the microcontroller 58 reads a voltage value from the voltage detector 55. Then, in step S33, the microcontroller 58 determines whether or not the current state is the constant voltage charge state. If the current state is the constant voltage charge state, the microcontroller 58 reads a current value from the current detector 53. Then, in step S37, the microcontroller 58 determines a capacitance from the read current value by referring to the data conversion table 63.

A system according to the fifth embodiment of the invention will be described, with reference to FIG. 8 which is a block diagram, too.

Figure 8:
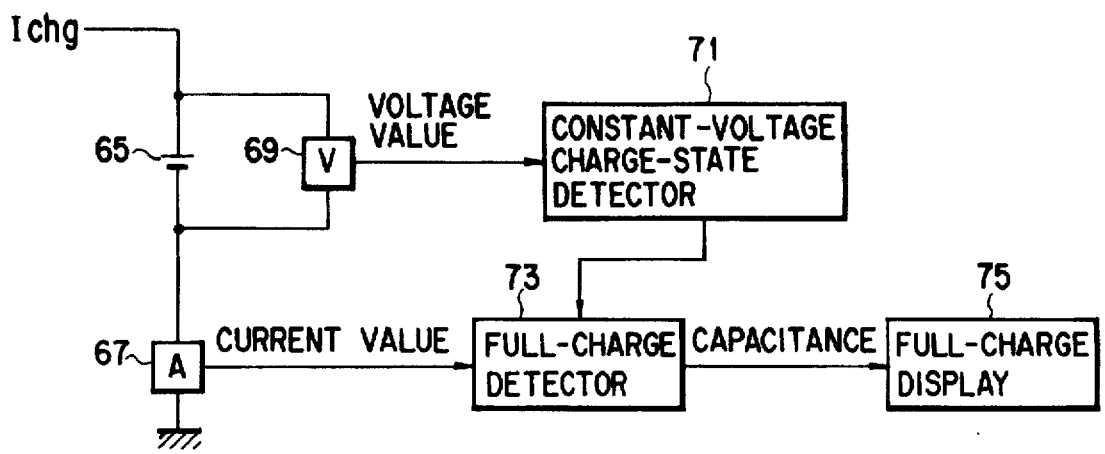
FIG. 8 is a block diagram of a fifth embodiment of the present invention.

As seen in FIG. 8, the system comprises a lithium ion secondary battery 65, an ammeter 67 and a voltmeter 69. The secondary battery 65 is of the type which is to be charged at a constant current and a constant voltage. The ammeter 67 is provided to measure the charge current (Ichg) supplied to the secondary battery 65. The voltmeter 69 is used to measure the charge voltage applied to the lithium ion secondary battery 65.

The system further comprises a constant-voltage charge state detector 71, a full-charge detector 73, and a full-charge display 75. The detector 71 is provided for monitoring the charge voltage measured by the voltmeter 69 and detects whether or not the secondary battery 65 is in a constant-voltage charge state. The full-charge detector 73 is designed to detect whether or not the current measured by the ammeter 29 has fallen below a predetermined value, and to determines that the secondary battery 65 has been fully charged, upon detecting that the current has fallen below the predetermined value. The display 75 is provided for displaying the full-charge state of the lithium ion secondary battery 65.

Figure 28:
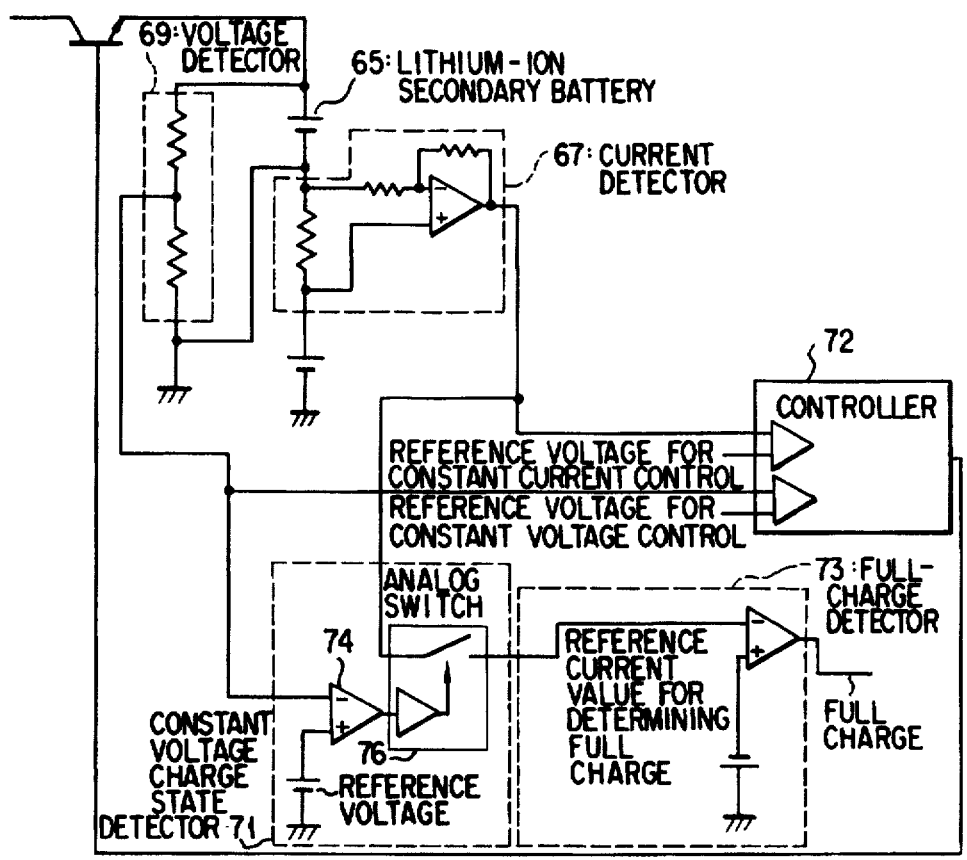
FIG. 28 is a detailed circuit diagram of the fifth embodiment shown in FIG. 8.

FIG. 28 is a detailed circuit diagram of the fifth embodiment shown in FIG. 8. The controller 72 receives a current value from the current detector 67 and compares with a reference voltage for constant current control. Furthermore, the controller 72 receives a voltage value from the voltage detector 69 and compares with the reference voltage for constant voltage control. Then, the controller 72 performs a constant-current constant-voltage charge operation based on the comparison results. The voltage comparator 74 in the constant voltage charge state detector 71 receives a detected voltage from the voltage detector 69 and compares with the reference voltage to detect the constant voltage charge state. Upon detecting the constant voltage charge state, the voltage comparator 74 outputs the detection result to an analog switch 76. In response to the detection result, the analog switch 76 turns on to supply a charge current from the current detector 67 to the full-charge detector 73. The full-charge detector 73 compares the supplied charge current with the reference current value to detect the full charge state. Upon detecting the full-charge state, the full-charge detector 73 outputs the full-charge signal to the full-charge display 75.

The operation of the system shown in FIG. 8 will be explained.

The constant-voltage charge state detector 71 continues to monitor the charge voltage measured by the voltmeter 69. Upon detecting that the secondary battery 65 assumes a constant-voltage charge state, the detector 71 activates the full-charge detector 73. Then, the full-charge detector 73 detects whether or not the current measured by the ammeter 29 has fallen below the predetermined value. When the detector 73 detects that the current has fallen below the predetermined value, it determines that the secondary battery 65 has been fully charged. Then, the detector 73 generates a signal, which is input to the full-charge display 75. Upon receipt of the signal, the display 75 displays the full-charge state of the lithium ion secondary battery 65.

A system according to the sixth embodiment of the invention will be described, with reference to FIG. 9 which is a block diagram.

Figure 9:
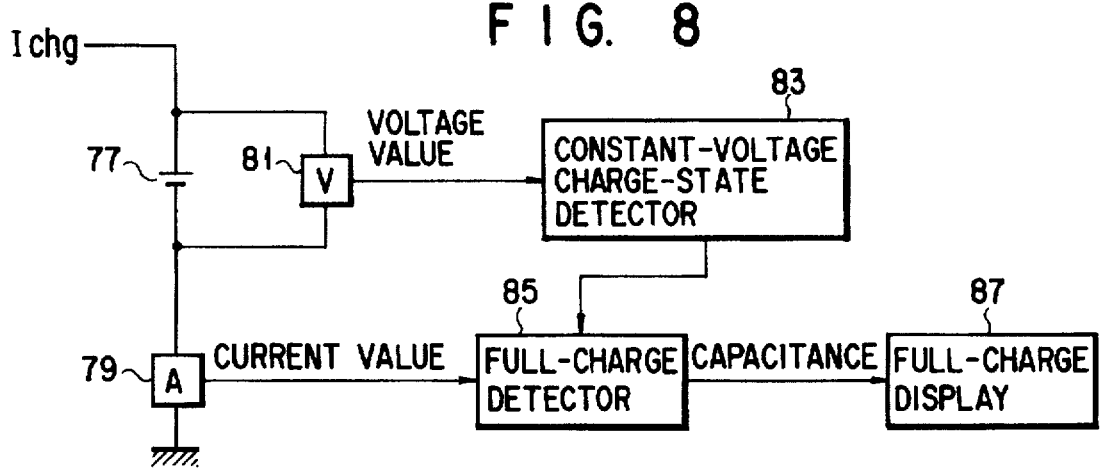
FIG. 9 is a block diagram of a sixth embodiment of the present invention.

As FIG. 9 clearly shows, the system comprises a lithium ion secondary battery 77, an ammeter 79 and a voltmeter 81. The secondary battery 77 is of the type which is to be charged at a constant current and a constant voltage. The ammeter 79 is connected in parallel to the battery 77 to measure the charge current (Ichg) supplied to the secondary battery 77. The voltmeter 81 is provided for measuring the charge voltage applied to the secondary battery 77.

As shown in FIG. 9, the system further comprises a constant-voltage charge state detector 83, a full-charge detector 85, and a full-charge display 87. The detector 83 is designed to monitor the charge voltage measured by the voltmeter 81 and to detect whether or not the secondary battery 77 is in a constant-voltage charge state. The full-charge detector 85 is of the type that detects whether or not the ratio of the charge current to the current the ammeter 79 detects when the battery 77 is charged at a constant current and a constant voltage has fallen below a predetermine value. The detector 85 determines that the secondary battery 77 has been fully charged, upon detecting that said current ratio has fallen below the predetermined value. The display 87 is provided for displaying the full-charge state of the lithium ion secondary battery 77.

Figure 29:
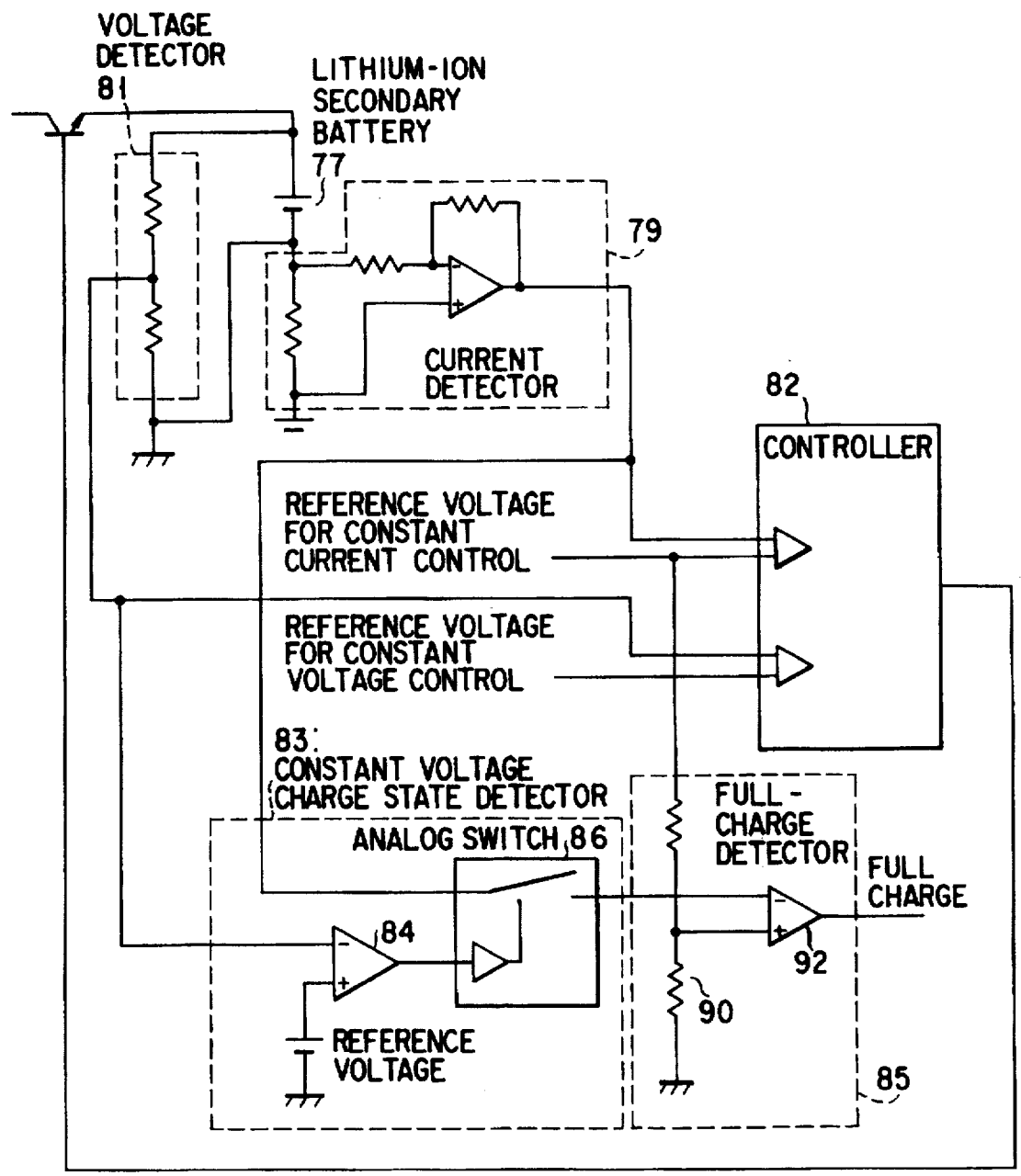
FIG. 29 is a detailed circuit diagram of the sixth embodiment shown in FIG. 9.

FIG. 29 is a detailed circuit diagram of the sixth embodiment shown in FIG. 9. The controller 82 receives a current value from the current detector 79 and compares with a reference voltage for constant current control. Furthermore, the controller 82 receives a voltage value from the voltage detector 81 and compares with the reference voltage for constant voltage control. Then, the controller 82 performs a constant-current constant-voltage charge operation based on the comparison results. The voltage comparator 84 in the constant voltage charge state detector 83 receives a detected voltage from the voltage detector 81 and compares with the reference voltage to detect the constant voltage charge state. Upon detecting the constant voltage charge state, the voltage comparator 84 outputs the detection result to an analog switch 86. In response to the detection result, the analog switch 86 turns on to supply a charge current from the current detector 79 to the full-charge detector 85. The voltage comparator 92 in the full-charge detector 85 compares the supplied charge current with the voltage obtained by the voltage-dividing resistors 88, 90 to detect that the charge current is a predetermined percentage or less of the charge current for the constant-current charge operation. Upon detecting that the charge current from the current detector 79 is the predetermined percentage or less of the charge current for the constant-current charge operation, the full-charge detector 85 outputs the full-charge signal to the full-charge display 87. It will be explained how the system of FIG. 9 performs its operation.

The constant-voltage charge state detector 83 keeps monitoring the charge voltage measured by the voltmeter 81. Upon detecting that the secondary battery 77 assumes a constant-voltage charge state, the detector 83 activates the full-charge detector 85. Then, the detector 85 detects if the current ratio, defined above, has fallen below the predetermined value. When the detector 85 detects that the current ratio has fallen below the predetermined value, it determines that the secondary battery 77 has been fully charged. Then, the detector 85 generates a signal, which is input to the full-charge display 87. Then, the display 87 displays the full-charge state of the lithium ion secondary battery 77.

In the sixth embodiment, the capacitance the battery 77 has when it is charged at a constant current and a constant voltage can readily and reliably be detected by measuring the output current of the battery 77. Furthermore, whether or not the battery 77 is fully charged can be accurately determined, because the output current of the battery 77 is the criterion.

A seventh embodiment of the invention will now be described, with reference to FIGS. 10 and 11 which are a block diagram and a flow chart, respectively.

The seventh embodiment comprises first means for detecting the residual capacitance of a secondary battery before charging the battery, second means for detecting the charge capacitance of the battery, and third means for outputting the current capacitance of the battery. When the first means detects that the secondary battery has no residual capacitance (capacitance of 0%, namely normal minimum discharge voltage), the charge accumulated until the battery is fully charged is regarded as the charge capacitance of the battery and is output as allowable discharge capacitance.

Figure 10:
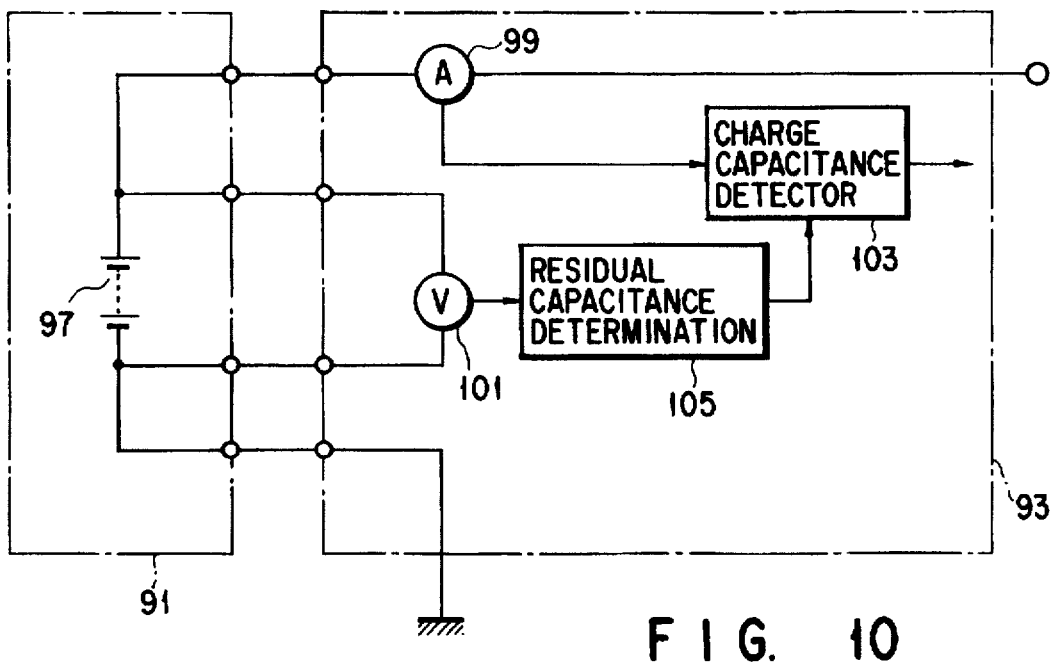
FIG. 10 is a block diagram of a seventh embodiment of the present invention.
Figure 11:
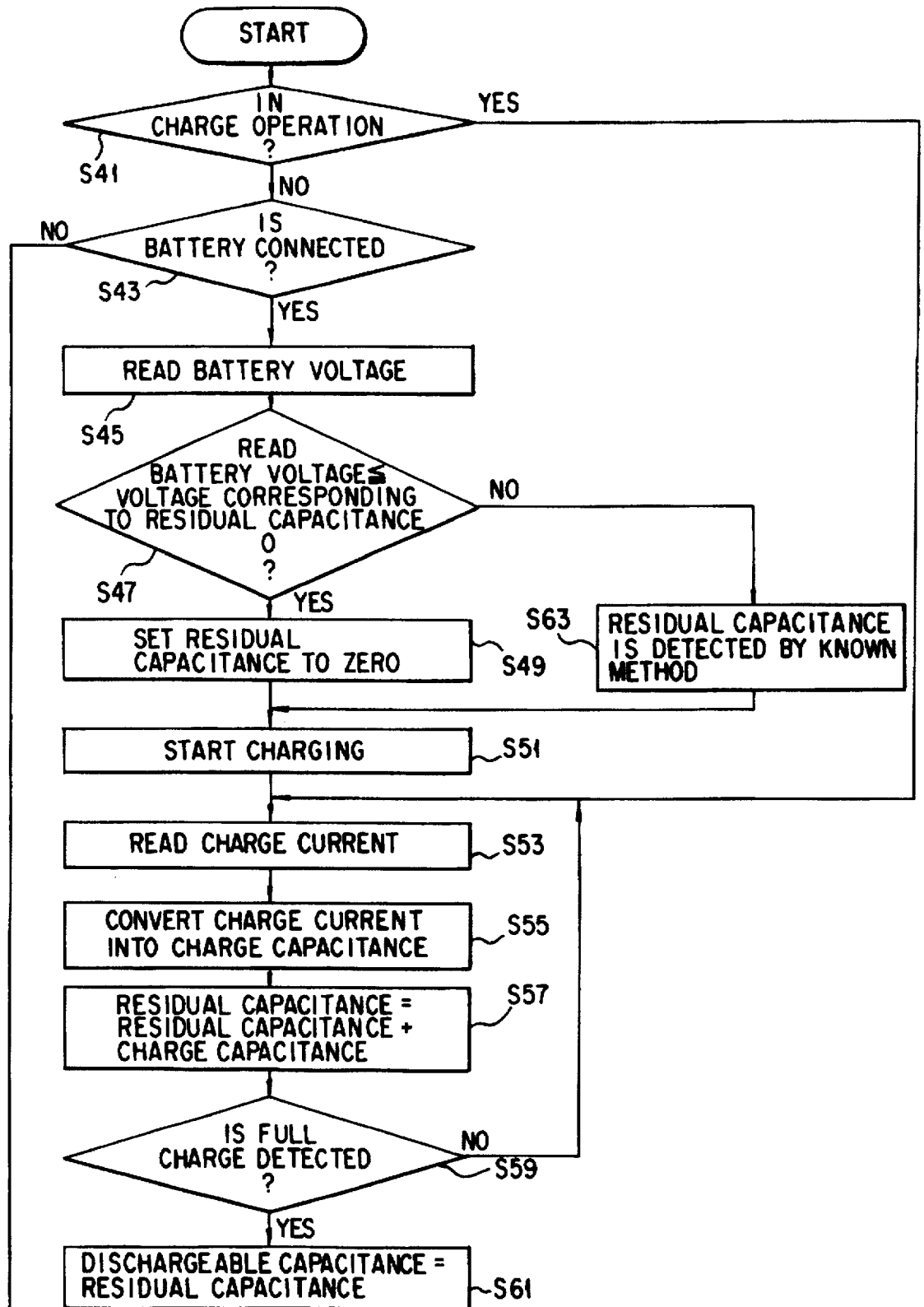
FIG. 11 is a flowchart illustrating a sequence of processes executed by the seventh embodiment.

FIG. 10 is a block diagram of the system. As shown in this figure, the system comprises a battery pack 91 and an electronic device 93 (hereinafter called "device"). The device 93 is used as a power supply for the battery pack 91 and to designed to perform charge-discharge control on the pack 91.

The battery pack 91 contains a secondary battery 97. The secondary battery 79 is, for example, a lithium ion battery, whose charge capacitance and discharge capacitance are substantially the same.

The device 93 has an ammeter 99, a voltmeter 101, a charge capacitance detector 103, and a residual capacitance-determining section 105. The ammeter 99 is used to measure the charge and discharge current of the secondary battery 97. The voltmeter 101 is provided for measure the output voltage of the battery 97. The charge capacitance detector 103 is designed to detect the charge capacitance of the battery pack 91 based on the charge current which the ammeter 99 measures while the battery 97 is being charged. The residual capacitance-determining section 105 determines the residual capacitance of the battery 97 from the voltage which the battery 97 output before the it is charged.

Figure 30:
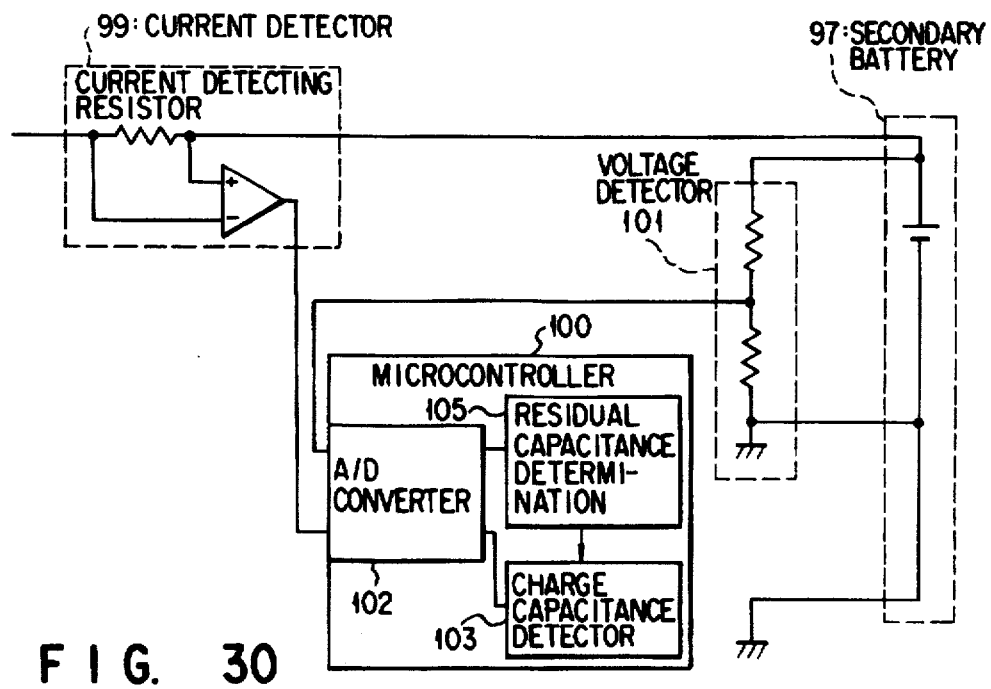
FIG. 30 is a detailed circuit diagram of the electroequipment main body shown in FIG. 10.

FIG. 30 is a detailed circuit diagram of the electronic equipment main body 93 shown in FIG. 10. The voltage detector 101 detects a voltage of the secondary battery 97 and supplies it to the microcontroller 100. The residual capacitance determining section 105 of the microcontroller 100 receives the detected voltage through the A/D converter 102 and determines the residual capacitance of the secondary battery 97. Then, the residual capacitance determining section 105 supplies the determination result to the charge capacitance determining section 103. The charge capacitance determining section 103 receives a detected current value from the current detector 99 through the A/D converter 102. Then, the charge capacitance determining section 103 converts the received charge current into a charge capacitance. Furthermore, the section 103 calculates the residual capacitance of the battery 97 based on the charge capacitance and the residual capacitance from the residual capacitance determining section 105.

An operation of the seventh embodiment will now be described with reference to the flowchart shown in FIG. 11. In step S41, the microcontroller 100 determines whether it is in charge operation or not. If it is in charge operation, the microcontroller 100 advances to step S53. On the other hand, if it is not in charge operation, the microcontroller 100 determines whether the battery 97 is connected or not (step S43). Upon determining that the battery 97 is connected, the microcontroller 100 reads a battery voltage from the voltage detector 101. Then, in step S47, the residual capacitance determining section 105 of the microcontroller 100 determines whether the read battery voltage is a voltage or less corresponding to the residual capacitance 0. If the read voltage is not a voltage or less corresponding to the residual capacitance 0, the residual capacitance is detected according to a known method (step S63).

On the other hand, if the read voltage is a voltage or less corresponding to the residual capacitance 0, the residual capacitance determining section 105 sets the residual capacitance to zero. Then, the microcontroller 100 starts the charge operation (step S51). In step S53, the charge capacitance detector 103 in the microcontroller 100 reads the charge current from the current detector 99 through the A/D converter 102. Then, the section 103 converts the read charge current into a charge capacitance. Furthermore, in step S57, the microcontroller 100 adds the residual capacitance to the charge capacitance and sets the addition result a new residual capacitance. Then, in step S59, the charge capacitance detector 103 determines whether or not the full charge is detected. If not in step S59, the control returns to step S53 and the steps S53 to S57 are repeated until the full charge is detected. On the other hand, if the full charge is detected in step S59, the section 103 detects the residual capacitance as the dischargeable capacitance.

Since the charge capacitance the battery 97 has at the completion of charging is detected as the allowable discharge capacitance, it is always possible to accurately determine the discharge capacitance to which the battery pack 91 can be charged at present.

Figure 14:
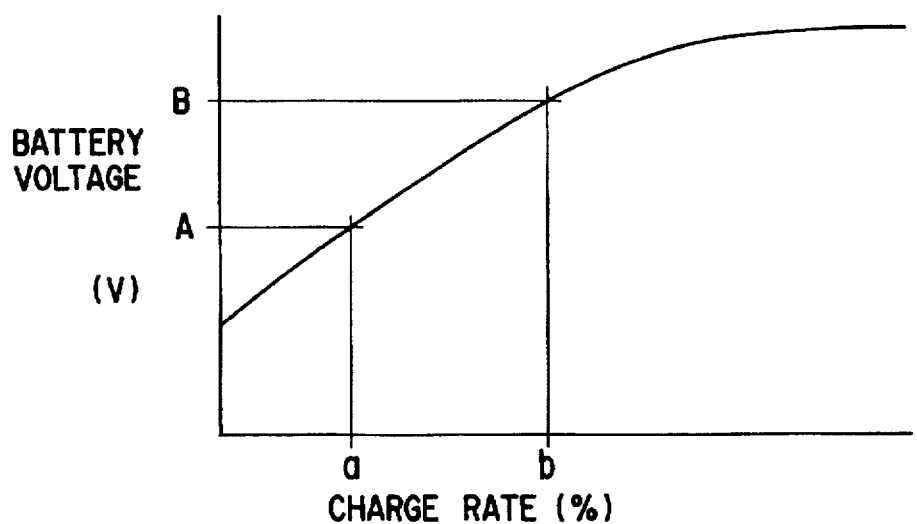
FIG. 14 is a characteristic chart showing the relation between the battery voltage and charge rate at the time of charging for explaining the operation of the eighth embodiment.

A system according to the eighth embodiment of the invention will now be described, with reference to FIGS. 12 to 14.

This system comprises first means for detecting a charge rate of a secondary battery from the voltage which the battery outputs before it is charged, while it is being charged or after it has been charged, and also has second means for detecting the charge capacitance of the secondary battery. During the charging of the battery, the first means detects the charge rate at a certain time when the battery outputs voltage (A), and also the charge rate at another time when the battery outputs voltage (B). The second means detects the charge capacitance the battery from the difference between the charge rates thus detected. The capacitance of the battery is predicted from this charge capacitance, and is output as allowable discharge capacitance of the secondary battery.

Figure 12:
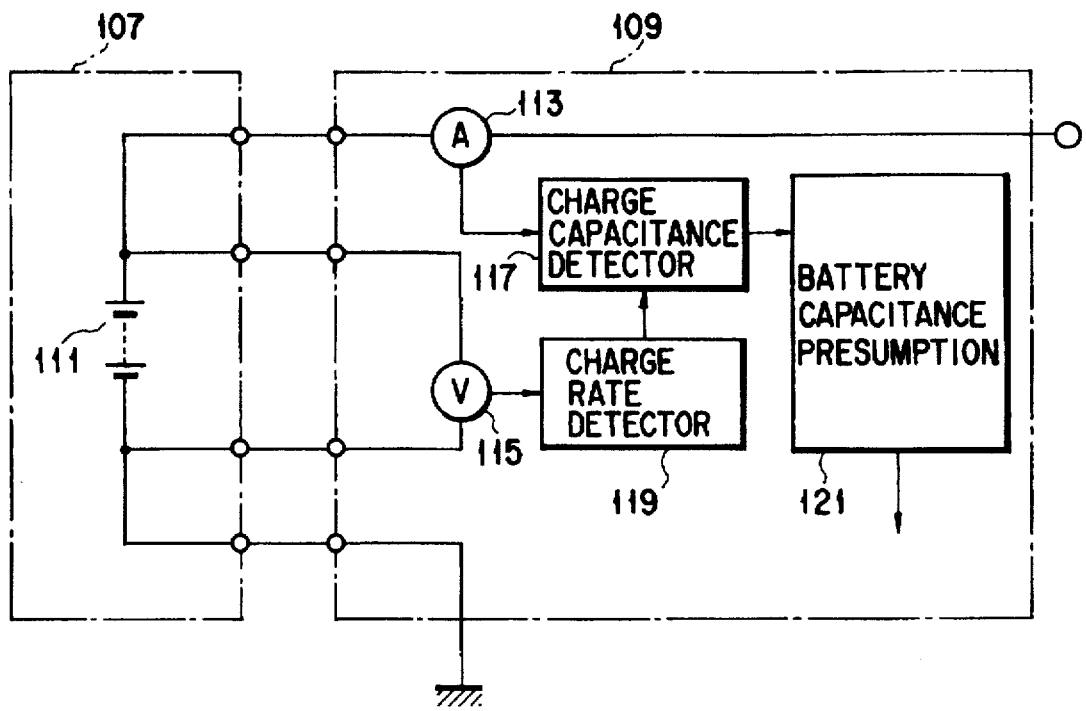
FIG. 12 is a block diagram of an eighth embodiment of the present invention.
Figure 13:
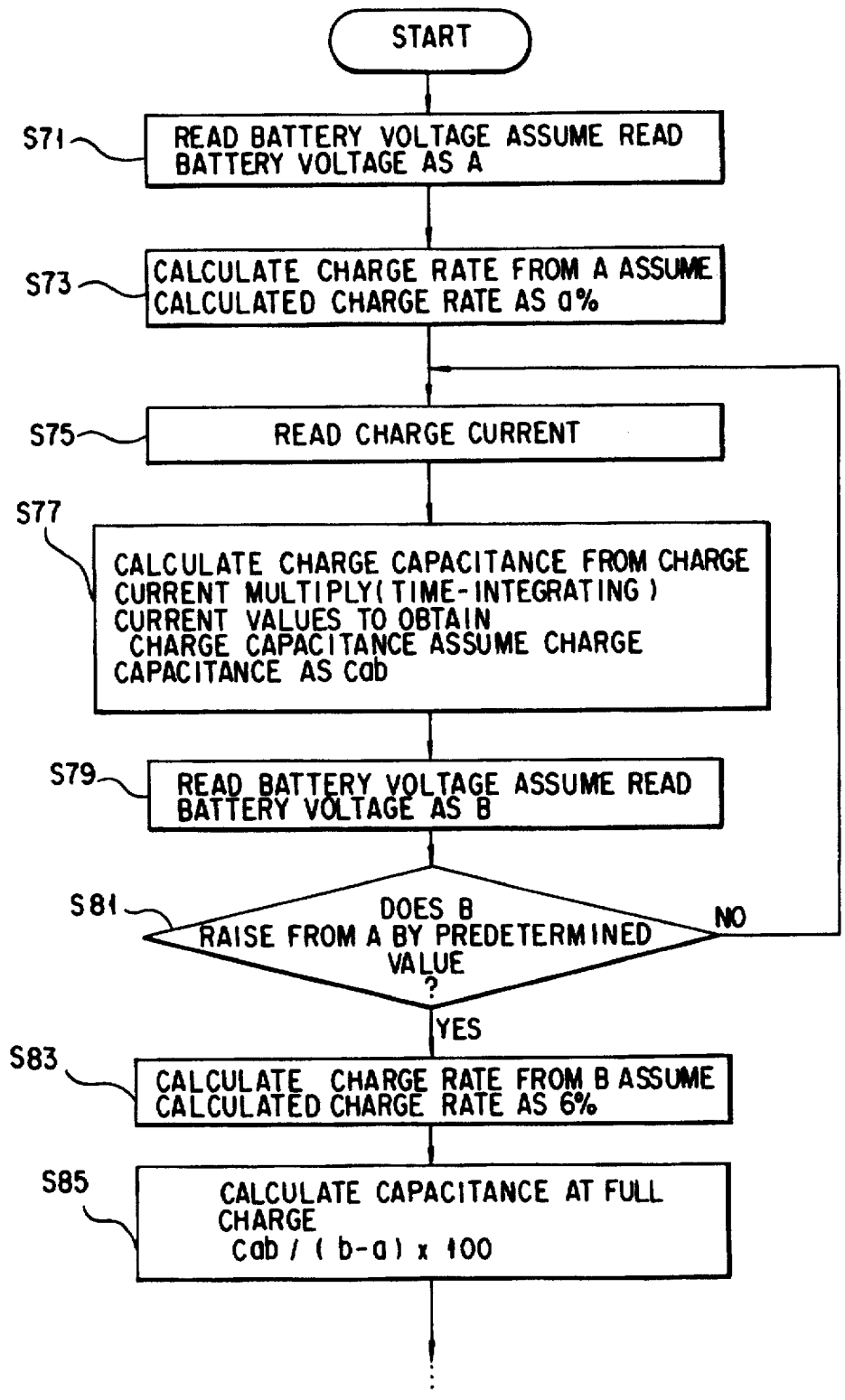
FIG. 13 is a flowchart illustrating a sequence of processes executed by the eighth embodiment.

FIG. 12 is a block diagram showing a charging system according to the eighth embodiment of the present invention.

As shown in FIG. 12, the system comprises a chargeable battery pack 107 incorporating a secondary battery therein, an electronic device 109 (hereinafter called "device") which operates with the battery pack 107 as a power supply. The device 109 charges or discharges the battery pack 107 when this battery pack is set at a battery pack placement section. A secondary battery 111 is incorporated in the battery pack 107. Like a lithium ion battery, the secondary battery 111 has a charge capacitance and a discharge capacitance which are similar to each other.

The system further comprises a secondary battery 111, an ammeter 113, a voltmeter 115, a charge capacitance detector 117, and a charge rate detector 119. The ammeter 113 is designed to detect the current with which to charge or discharge the secondary battery 111 of the battery pack 107 set in the main body 109. The voltmeter 115 is provided for detecting the voltage generated by the secondary battery of the battery pack 107. The charge capacitance detector 117 is used to detect the charge capacitance of the battery pack 107 on the basis of the current used for charging the second battery. The charge rate detector 119 is provided for detecting the charge rate of the secondary battery 111 on the basis of the battery voltage which the voltmeter 115 senses when the battery pack 107 is set in the main body 109, for charging.

The system further comprises a battery capacitance-presuming section 121 for presuming the battery capacitance of a fully-charged battery. The section 121 presumes the battery capacitance of a fully-charged battery on the basis of the following: the charge rate (a %) corresponding to battery voltage level A at one point of time during charging; the charge rate (b %) corresponding to battery voltage level B at another point of time during charging; and the charge capacitance between level A and level B.

FIG. 31 is a detailed circuit diagram of the electronic equipment main body 109 shown in FIG. 12. The voltage detector 115 detects a voltage of the secondary battery 111 and supplies it to the microcontroller 114. The charge rate detector 119 of the microcontroller 114 receives the detected voltage through the A/D converter 116 and detect the charge rate of the battery 111 from the detected voltage of the battery 111. Then, the charge rate detector 119 supplies the detected charge rate to the charge capacitance detector 117. The charge capacitance detector 117 receives a charge current from the current detector 113 through the A/D converter 116. Then, the charge capacitance detector 117 detect a charge capacitance of the battery 111 based on the charge rate and the charge current. Then, the charge capacitance detector 117 supplies the charge capacitance and the charge rate to the battery capacitance presuming section 121. The battery capacitance presuming section 121 presumes the battery capacitance at full charge based on the supplied charge rate and the charge capacitance.

An operation of the eighth embodiment will now be described with reference to the flowchart shown in FIG. 13 and the operational characteristic shown in FIG. 14.

When the battery pack 107 is mounted on the electronic equipment main body 109 and the charge operation is started, the voltage detector 115 detects a voltage of the battery being charged. Assume now that this detected voltage is A (step S71). The detected voltage from the voltage detector 115 is supplied to the charge rate detector 119 in the microcontroller 114 through the A/D converter 116. In step S73, the charge rate detector 119 calculates a charge rate of the battery from A based on the characteristic curve showing a relation between a battery voltage and a charge rate shown in FIG. 14. Assume now that a charge rate corresponding to the voltage A is a %. The detected charge rate from the charge rate detector 119 is supplied to the charge capacitance detector 117. The charge capacitance detector 117 reads a charge current from the current detector 113 through the A/D converter 116 (step S75). Then, in step S77, the charge capacitance detector 117 calculates the charge capacitance from the charge current. More specifically, the charge capacitance detector 117 time-integrates the charge currents to obtain the charge capacitance. Assume now that the obtained charge capacitance is Cab.

In step S79, the charge rate detector 119 reads the battery voltage from the voltage detector 115. Assume now that this read voltage is B. Then, in step S81, the charge rate detector 119 determines whether B raises from A by a predetermined value. If not in step S81, the control returns to step S75 and the steps S75 to S81 are repeated until B raises from A by a predetermined value. On the other hand, if it is determined that B raises from A by a predetermined value, the charge rate detector 119 calculates the charge rate from the voltage B based on the characteristic curve shown in FIG. 14. Assume now that this charge rate corresponding to the voltage B is b % (step S83). In step S85, the battery capacitance presuming section 121 receives the charge rates of a % and b % from the charge rate detector 119 as well as the charge capacitance Cab from the charge capacitance detector 117 and calculates the battery capacitance at full charge based on the equation of Cab/(b−a)×100. Accordingly, the battery capacitance presuming section 121 detects the calculated capacitance at full charge as a dischargeable capacitance of the battery.

As can be seen from the above, the allowable discharge capacitance of each battery pack can be easily presumed on the basis of the charge rates detected at two points of time during charging or at two points before and after charging, and the charge capacitance between the charge rates. In addition, the presumed allowable discharge capacitance is as close as possible to the actual allowable discharge capacitance.

Figure 15:
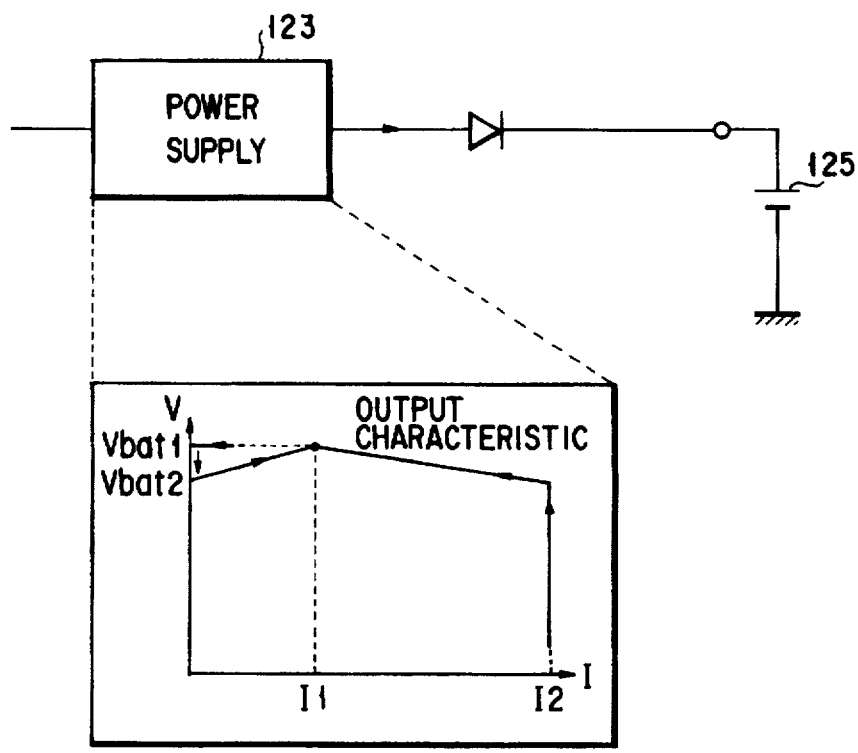
FIG. 15 is a block diagram of a ninth embodiment of the present invention.

FIG. 15 is a block diagram showing a charging system according to the ninth embodiment of the present invention. The charging system of the ninth embodiment is designed to charge a lithium ion battery 125 employed in a personal computer, and constitutes part of the power supply circuit of that personal computer.

Figure 1:
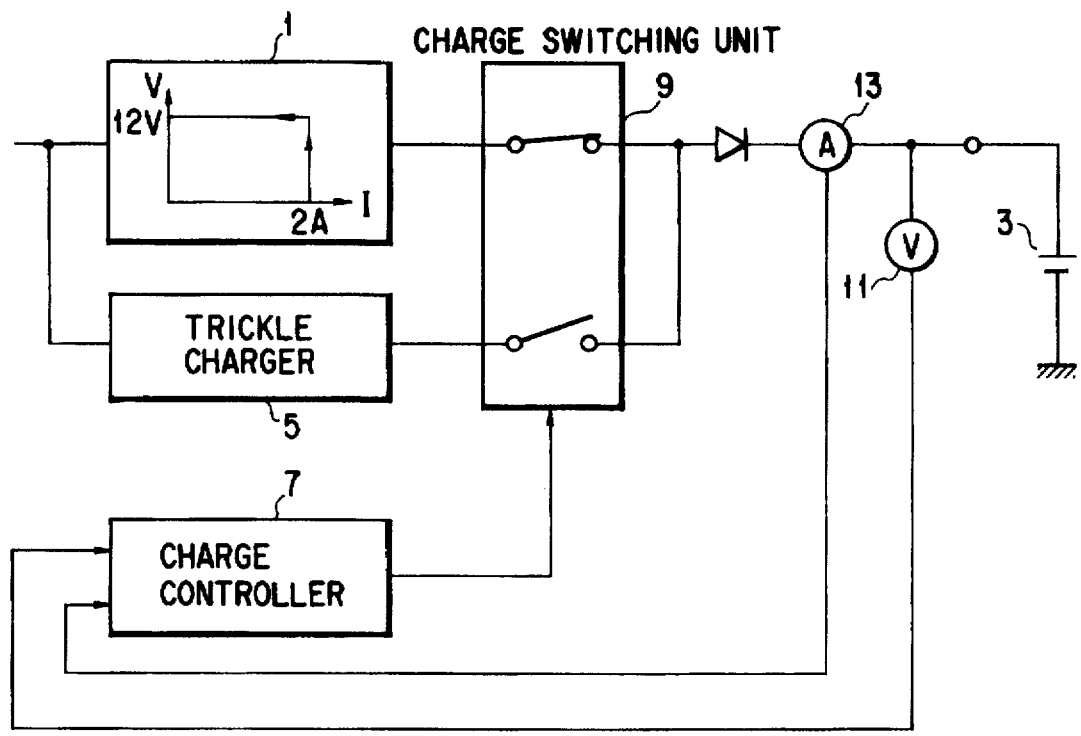
FIG. 1 is a block diagram of a conventional charging apparatus.
Figure 2:
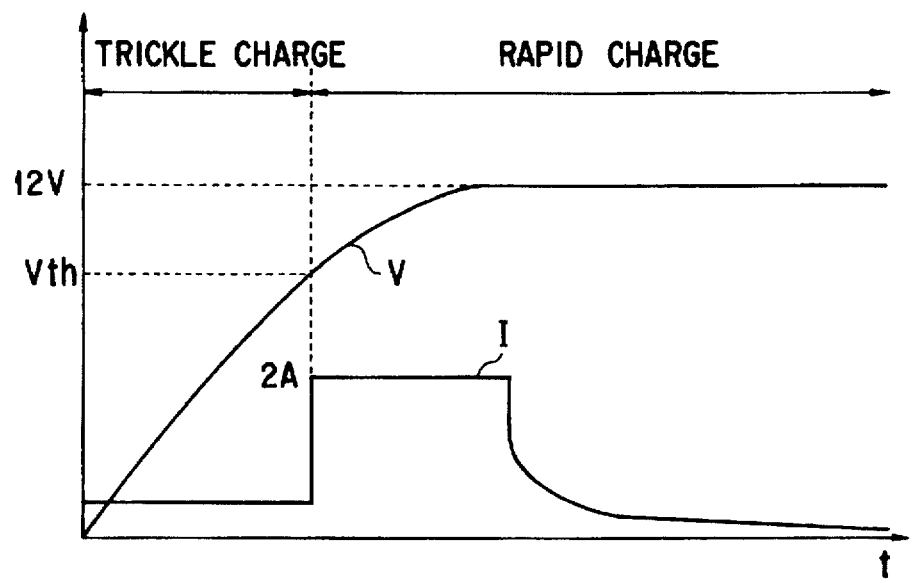
FIG. 2 is a diagram illustrating the charging operation of the charging apparatus in FIG. 1.
Figure 3:
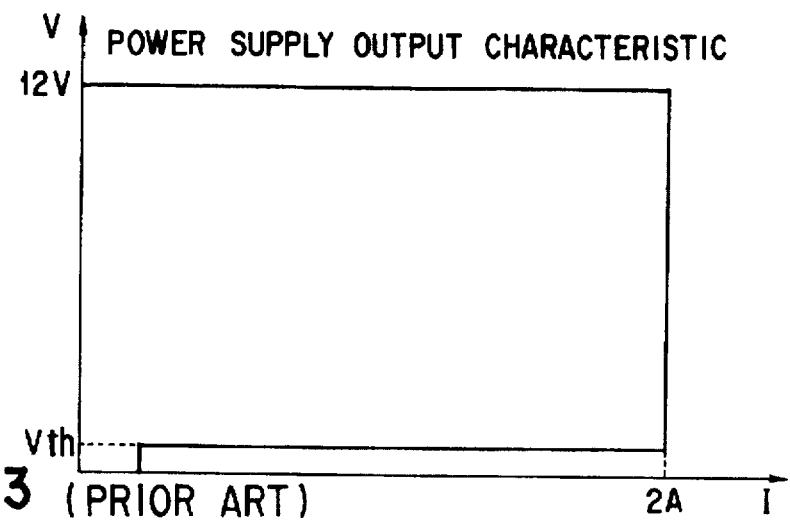
FIG. 3 is a diagram showing the output characteristic of a power supply provided in the charging apparatus in FIG. 1.

Like the power supply system shown in FIG. 1, the power supply device 123 of the charging system comprises a constant-current power supply circuit and a constant-voltage power supply circuit. In the initial stage of a charging process, the lithium ion battery 125 is charged by the constant current (I2) output by the constant-current power supply circuit. When the battery voltage of the lithium ion battery 125 has exceeded a predetermined voltage, the constant-voltage power supply circuit starts constant-voltage charge. As shown in the figures, the constant-voltage power supply circuit has output characteristics wherein the ratio of a variation (dv) in the output voltage (v) to a variation (di) in the output current (i) is positive (dv/di>0) when the output current is smaller than a predetermined value (I1), and wherein that ratio is negative (dv/di<0) when the output current exceeds the predetermined value (I1).

Supplemental charge, which is subsequent to full charging of the lithium ion battery 125, is executed by utilization of the output characteristic represented by dv/di>0.

FIG. 32 is a detailed circuit diagram of the power supply 123 shown in FIG. 15. In FIG. 32, the power supply 123 includes a voltage detector 131, a current detector 133 and a controller 135. The voltage detector 131 detects a voltage of the battery 125 through the voltage detecting resistors 137, 139 and supplies the detected voltage to the controller 135. The current detector 133 detects a current of the battery 125 through a current detecting resistor 141 and outputs the detected current to the controller 135. The controller 135 controls a power to be supplied to the battery 125 so that the detected voltage V and the detected current I exhibit the characteristic shown in FIG. 15.

Figure 16:
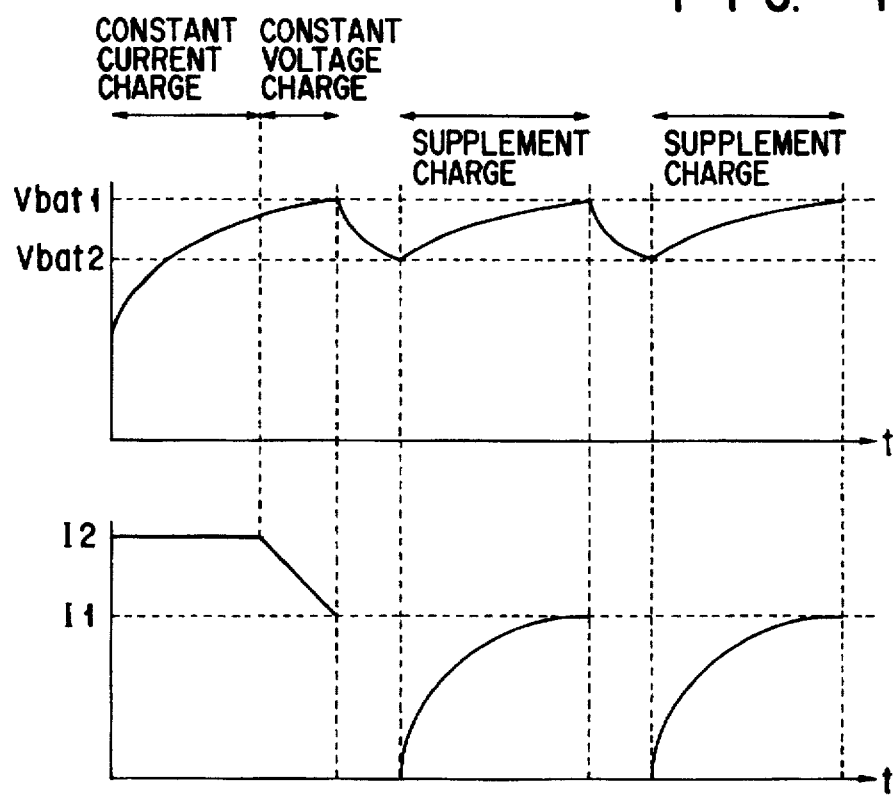
FIG. 16 is a diagram showing the charging operation of the charging apparatus in FIG. 15.

The operation of the charging system shown in FIG. 15 will be described with reference to FIG. 16.

When the battery voltage of the lithium ion battery 125 increases to a predetermined value after the charging process utilizing constant current I2, constant-voltage charge having a characteristic of dv/di<0 is started. When the battery voltage of the lithium ion battery 125 has reached Vbat1, the lithium ion battery 125 is regarded as having been fully charged. In the full charge state, no charge current flows inside the lithium ion battery 125.

Thereafter, the battery voltage of the lithium ion battery gradually decreases from Vbat1, due to self-discharge. When the battery voltage of the lithium ion battery 125 has reached Vbat2, constant-voltage charge is restarted by utilizing a characteristic of dv/di>0. Since the battery voltage of the lithium ion battery 125 reaches Vbat1 after a certain length of time, the lithium ion battery 125 is set in the fully-charged state again.

When the battery voltage of the lithium ion battery 125 decreases to Vbat2, the constant-voltage charge having a characteristic of dv/di>0 is started again.

As described above, after the lithium ion battery 125 is fully charged, a charge operation having a characteristic of dv/di>0 is repeatedly executed each time the battery voltage of the lithium ion battery 125 decreases to Vbat2. Due to the utilization of the characteristic dv/di>0, supplement charge can be executed based on a comparatively limited current value (<I1).

Since supplement charge is executed intermittently, the lithium ion battery 125 is not much degraded in performance, in comparison with the case where a voltage is kept applied to the lithium ion battery 125.

The power supply device 123 of the charging system can be easily obtained by combining a constant voltage circuit having a characteristic of dv/di>0 with a constant voltage circuit having a characteristic of dv/di<0. Specific examples of such a power supply device 123 are shown in FIGS. 17 and 18.

Figure 17:
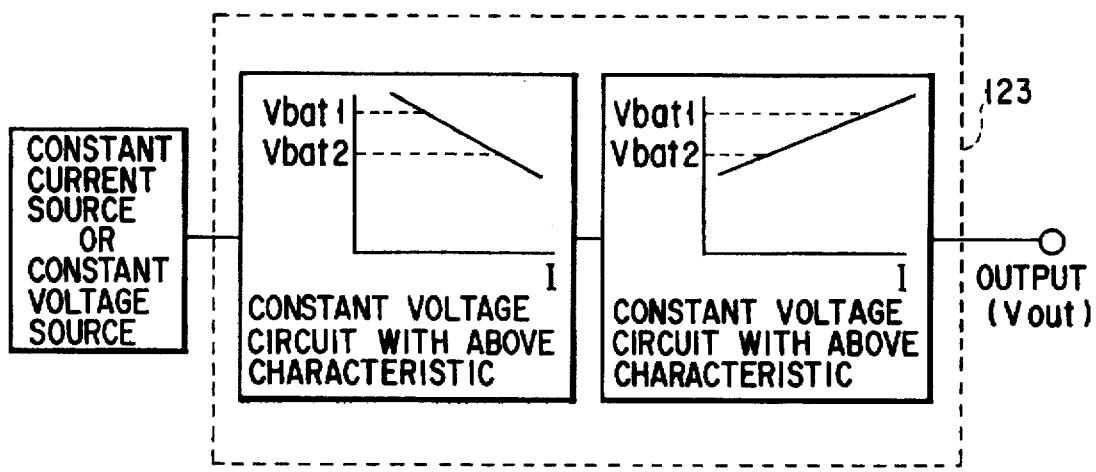
FIG. 17 is a diagram showing one example of the specific structure of the charging operation of the charging apparatus in FIG. 15.
Figure 18:
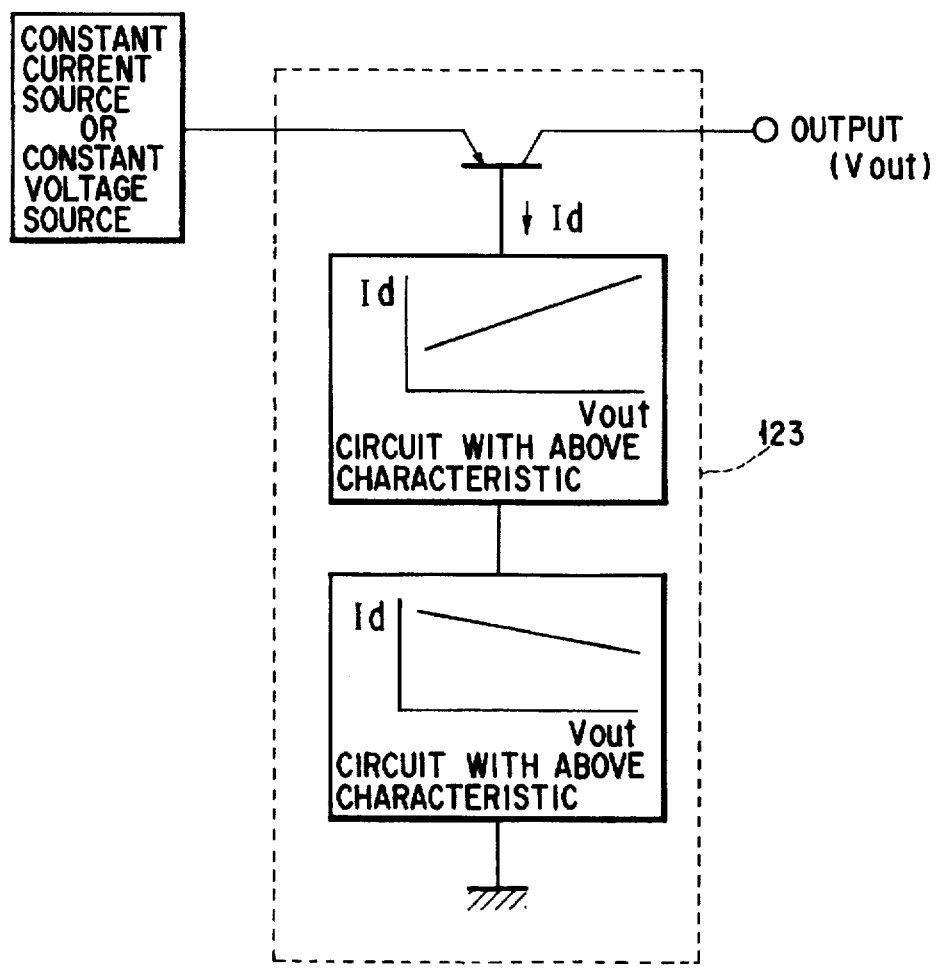
FIG. 18 is a diagram showing another example of the specific structure of the charging operation of the charging apparatus in FIG. 15.

In the example shown in FIG. 17, constant voltage circuits having the depicted output characteristics are connected in series to obtain a power supply device 123. In the example shown in FIG. 18, constant voltage circuits having the depicted output characteristics are connected in series, and the resultant circuit is used for controlling the base current of an NPN transistor.

FIG. 19 shows a charging system according to the tenth embodiment of the present invention.

The power supply device 127 of the charging system automatically switches between trickle charge and rapid charge. As indicated in FIG. 19, the power supply device 127 has output characteristics wherein the ratio of a variation (dv) in the output voltage (v) to a variation (di) in the output current (i) is positive (dv/di>0) when the output voltage is lower than a predetermined value (Vbat1). When the output voltage exceeds the predetermined value (Vbat1), a constant-current charge utilizing current I1 is executed.

FIG. 33 is a detailed circuit diagram of the power supply 127 shown in FIG. 19. In FIG. 33, the power supply 127 includes a voltage detector 143, a current detector 145 and a controller 147. The voltage detector 143 detects a voltage of the battery 125 through the voltage detecting resistors 149, 151 and supplies the detected voltage to the controller 147. The current detector 145 detects a current of the battery 125 through a current detecting resistor 153 and outputs the detected current to the controller 147. The controller 147 controls a power to be supplied to the battery 125 so that the detected voltage V and the detected current I exhibit the characteristic shown in FIG. 19.

The operation of the charging system shown in FIG. 19 will be described with reference to FIG. 20.

When the battery voltage of the lithium ion battery 125 is lower than Vbat1, the power supply device 127 starts trickle charge for the lithium ion battery 125 on the basis of a current value smaller than I1. The value of the charge current is determined by the battery voltage of the lithium ion battery 125. To be more specific, the lower the battery voltage of the lithium ion battery, the smaller will be the value of the charge current. When the battery voltage of the lithium ion battery 125 exceeds Vbat1, rapid charge is executed by using a constant current of I1.

In the manner described above, the charge current is automatically decreased when the battery voltage of the lithium ion battery 125 is low. Therefore, trickle charge can be automatically executed for a battery of low voltage, without the need of a special controller.

Figure 21:
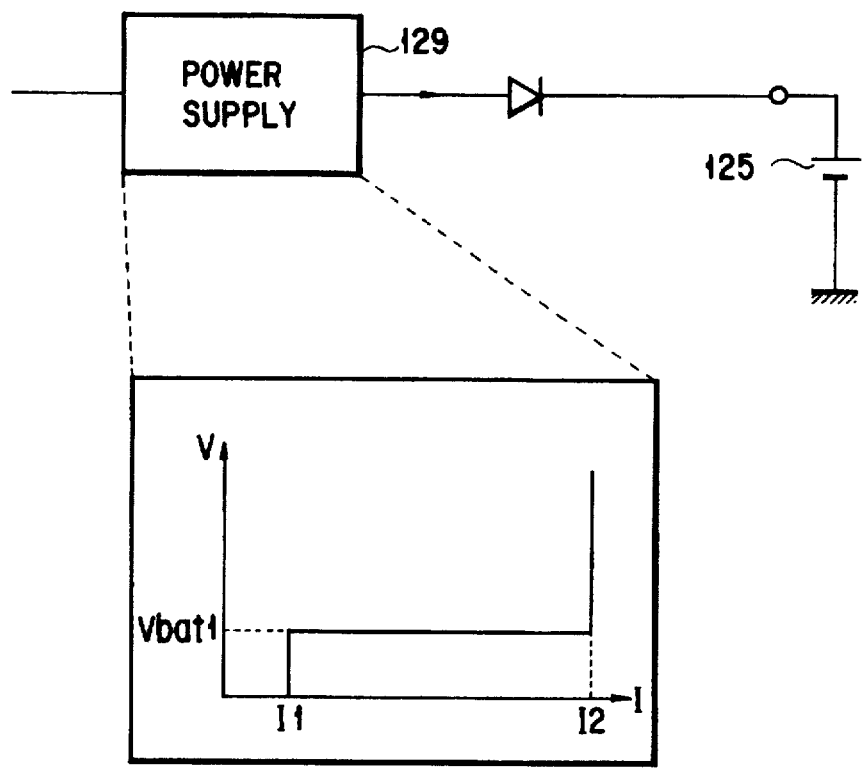
FIG. 21 is a diagram of a charging apparatus according to an eleventh embodiment of this invention and its output characteristic.

FIG. 21 shows a charging system according to the eleventh embodiment of the present invention. Like the power supply device 127 depicted in FIG. 19, the power supply device 129 of the charging system automatically switches between trickle charge and rapid charge. As indicated in FIG. 21, the output current is controlled to be I1 when the output voltage is equal to or lower than a predetermined value (Vbat1), and is controlled to be I2 (I2>I1) when the output voltage exceeds the predetermined value (Vbat1).

FIG. 34 is a detailed circuit diagram of the power supply 129 shown in FIG. 21. In FIG. 34, the power supply 129 includes a voltage detector 155, a current detector 157 and a controller 159. The voltage detector 155 detects a voltage of the battery 125 through the voltage detecting resistors 161, 163 and supplies the detected voltage to the controller 159. The current detector 157 detects a current of the battery 125 through a current detecting resistor 165 and outputs the detected current to the controller 159. The controller 159 controls a power to be supplied to the battery 125 so that the detected voltage V and the detected current I exhibit the characteristic shown in FIG. 21.

Figure 22:
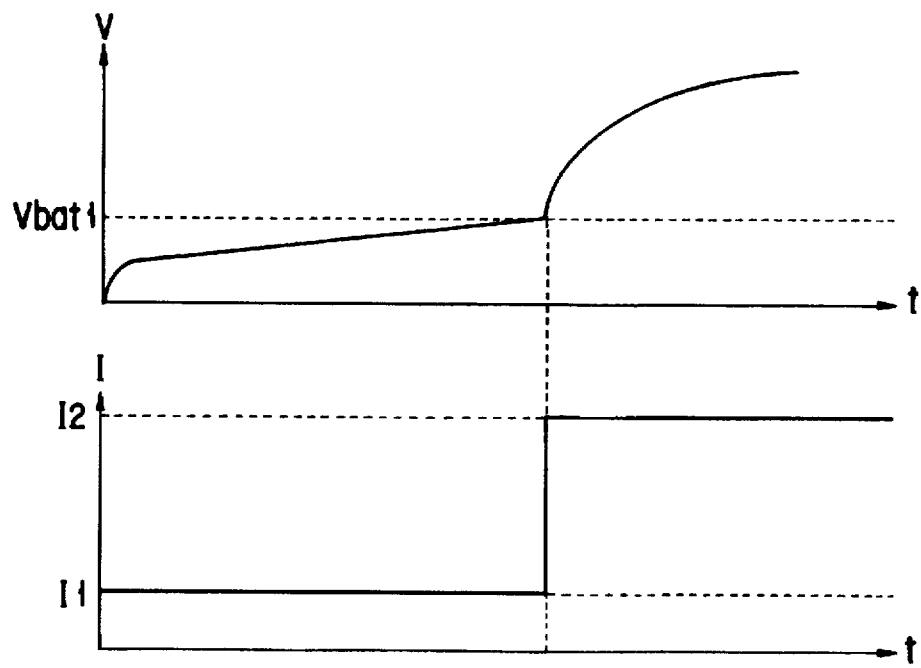
FIG. 22 is a diagram showing the charging operation of the charging apparatus in FIG. 21.

The operation of the charging system shown in FIG. 21 will be described with reference to FIG. 22.

When the battery voltage of the lithium ion battery 12 is equal to or lower than Vbat1, the power supply device 127 performs trickle charge for the lithium ion battery 125 by use of a constant current of I1. When, thereafter, the battery voltage of the lithium ion battery 125 exceeds Vbat1, rapid charge is started by use of a constant current of I2.

As in the foregoing embodiments, the charge current is automatically decreased in the present embodiment when the battery voltage of the lithium ion battery 125 is low. Therefore, trickle charge can be automatically executed for a battery of low voltage, without using a special controller.

As can be seen from the foregoing, where a power supply circuit having such characteristics as are shown in either FIG. 19 or FIG. 21 is employed as the constant-current power supply circuit of the power supply device 123 shown in FIG. 15, supplement charge can be automatically executed after the battery has been fully charged. In addition, trickle charge can be automatically executed when the battery voltage is low.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A system comprising:

a rechargeable battery charged with a constant voltage, said battery including an overvoltage detector detecting an overvoltage, and a storage unit storing data; and a charger charging said rechargeable battery with constant voltage, said charger including, means for reading an over-voltage detection signal from said rechargeable battery, means for sending information to said storage unit and means for reading the information from said storage unit, said charger assigned to identification data, sending voltage data representing a charge voltage when a detector detects an overvoltage, and identification data assigned to said charger, whereby the voltage and identification data are stored in the storage unit, reading the identification data stored in the storage unit when the battery is attached to the charger, charging the battery with the constant voltage in response to the voltage data stored in the storage unit if the identification data stored in the storage unit coincides with the identification data of the charger.

2. A full-charge detecting apparatus for use in a charge controller for a rechargeable battery to be charged at a constant voltage, said apparatus comprising:

current measuring means for measuring a charge current of a rechargeable battery;

constant-voltage charge state detecting means for detecting that said rechargeable battery is in a constant-voltage charge state; and full-charge detecting means for detecting that said rechargeable battery is fully charged, when the current measured by said current measuring means is equal to or lower than a predetermined value when the constant-voltage charge state detecting means detects that said rechargeable battery assumes the constant-voltage charge state.

3. A full-charge detecting apparatus for use in a charge controller for a rechargeable battery to be charged at a constant voltage, said apparatus comprising:

current measuring means for measuring a charge current of a rechargeable battery;

constant-voltage charge state detecting means for detecting that said rechargeable battery is in a constant-voltage charge state; and full-charge detecting means for detecting that said rechargeable battery is fully charged, if the ratio of the current measured by said current measuring means to the current output by said rechargeable battery while undergoing constant-current charge is equal to or less than a predetermined ratio when the constant-voltage charge state detecting means detects that said rechargeable battery assumes the constant-voltage charge state.

4. The system according to claim 1, further comprising:

current measuring means for measuring a charge current of a rechargeable battery;

constant-voltage charge state detecting means for detecting that said rechargeable battery is in a constant-voltage charge state; and full-charge detecting means for detecting that said rechargeable battery is fully charged when the current measured by said current measuring means is equal to or lower than a predetermined value when the constant-voltage charge state detecting means detects that said rechargeable battery assumes the constant-voltage charge state.

5. A system comprising:

a rechargeable battery charged with a constant voltage, said battery including a storage unit storing charge voltage data;

a charger reading the charge voltage data from the storage unit and charging the battery in accordance with the read charge voltage data;

current measuring means for measuring a charge current of a rechargeable battery;

constant-voltage charge state detecting means for detecting that said rechargeable battery is in a constant-voltage charge state; and full-charge detecting means for detecting that said rechargeable battery is fully charged when the current measured by said current measuring means is equal to or lower than a predetermined value when the constant-voltage charge state detecting means detects that said rechargeable battery assumes the constant-voltage charge state.

6. The system according to claim 1, further comprising:

current measuring means for measuring a charge current of a rechargeable battery;

constant-voltage charge state detecting means for detecting that said rechargeable battery is in a constant-voltage charge state; and full-charge detecting means for detecting that said rechargeable battery is fully charged, if the ratio of the current measured by said current measuring means to the current output by said rechargeable battery while undergoing constant-current charge is equal to or less than a predetermined ratio when the constant-voltage charge state detecting means detects that said rechargeable battery assumes the constant-voltage charge state.

7. A system comprising:

a rechargeable battery charged with a constant voltage, said battery including a storage unit storing charge voltage data;

a charger reading the charge voltage data from the storage unit and charging the battery in accordance with the read charge voltage data;

current measuring means for measuring a charge current of a rechargeable battery;

constant-voltage charge state detecting means for detecting that said rechargeable battery is in a constant-voltage charge state; and full-charge detecting means for detecting that said rechargeable battery is fully charged, if a ratio of the charge current measured by said current measuring means to a current output by said rechargeable battery while undergoing constant-current charge is equal to or less than a predetermined value when the constant-voltage charge state detecting means detects that said rechargeable battery assumes the constant-voltage charge state.

8. A full-charge detecting apparatus for use in a charge controller for a rechargeable battery to be charged at a constant voltage, said apparatus comprising:

current measuring means for measuring a charge current of a secondary battery; and full-charge detecting means for detecting that said rechargeable battery is in a constant-voltage charge state, and for detecting that said rechargeable battery is fully charged when the current measured by said current measuring means is equal to or lower than a predetermined value while the rechargeable battery assumes the constant-voltage charge state.

9. A full-charge detecting apparatus for use in a charge controller for a rechargeable battery to be charged at a constant voltage, said apparatus comprising:

current measuring means for measuring a charge current of a rechargeable battery; and full-charge detecting means for detecting that said rechargeable battery is in a constant-voltage charge state, and for detecting that said rechargeable battery is fully charged if a ratio of the charge current measured by said current measuring means to a current output by said rechargeable battery is equal to or less than a predetermined value while said rechargeable battery is in the constant-voltage charge state.

* * * * *